(12) United States Patent
Feng et al.

(10) Patent No.: US 11,227,550 B2
(45) Date of Patent: Jan. 18, 2022

(54) ELECTRONIC PANEL, DISPLAY DEVICE, AND DRIVING METHOD

(71) Applicants: HEFEI BOE JOINT TECHNOLOGY CO., LTD., Hefei (CN); BOE TECHNOLOGY GROUP CO., LTD., Beijing (CN)

(72) Inventors: Xuehuan Feng, Beijing (CN); Yongqian Li, Beijing (CN); Zhidong Yuan, Beijing (CN); Can Yuan, Beijing (CN)

(73) Assignees: HEFEI BOEJO INTTECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/753,443

(22) PCT Filed: Sep. 26, 2019

(86) PCT No.: PCT/CN2019/108153
§ 371 (c)(1),
(2) Date: Apr. 3, 2020

(87) PCT Pub. No.: WO2020/082979
PCT Pub. Date: Apr. 30, 2020

(65) Prior Publication Data
US 2021/0201804 A1 Jul. 1, 2021

(30) Foreign Application Priority Data
Oct. 24, 2018 (CN) .......................... 201811244287.7

(51) Int. Cl.
*G09G 3/3266* (2016.01)
*G09G 3/3233* (2016.01)
*G11C 19/28* (2006.01)

(52) U.S. Cl.
CPC ......... *G09G 3/3266* (2013.01); *G09G 3/3233* (2013.01); *G11C 19/28* (2013.01);
(Continued)

(58) Field of Classification Search
CPC ............... G09G 3/3266; G09G 3/3233; G09G 2300/0426; G09G 2300/0465;
(Continued)

(56) References Cited

U.S. PATENT DOCUMENTS

| 10,366,651 | B2 | 7/2019 | Ha |
| 2008/0129652 | A1 | 6/2008 | Park |

(Continued)

FOREIGN PATENT DOCUMENTS

| CN | 101093304 A | 12/2007 |
| CN | 103578411 A | 2/2014 |

(Continued)

OTHER PUBLICATIONS

First Chinese Office Action related to Chinese Patent No. 201811244287.7 dated Dec. 26, 2019.

*Primary Examiner* — Stephen G Sherman
(74) *Attorney, Agent, or Firm* — Dilworth & Barrese, LLP.; Michael J. Musella, Esq.

(57) ABSTRACT

An electronic panel, a display device, and a driving method are disclosed. In the electronic panel, each sub-pixel unit includes a light emitting unit, a pixel driving circuit for driving the light emitting unit to emit light, and a sensing circuit for sensing the pixel driving circuit; the gate driving circuit includes N+1 output terminals, and is configured to output gate scanning signals that turn on the N rows of the plurality of sub-pixel units row by row; the pixel driving circuits of the sub-pixel units in a j-th row are connected to a j-th output terminal of the gate driving circuit to receive the gate scanning signal as a scanning driving signal, and the (Continued)

sensing circuits of the sub-pixel units in the j-th row are connected to a (j+1)-th output terminal of the gate driving circuit to receive the gate scanning signal as a sensing driving signal.

18 Claims, 18 Drawing Sheets

(52) U.S. Cl.
CPC .............. *G09G 2300/0426* (2013.01); *G09G 2300/0465* (2013.01); *G09G 2300/0842* (2013.01); *G09G 2310/0202* (2013.01); *G09G 2310/0286* (2013.01); *G09G 2310/061* (2013.01); *G09G 2310/08* (2013.01); *G09G 2320/0233* (2013.01); *G09G 2330/08* (2013.01)

(58) Field of Classification Search
CPC ... G09G 2300/0842; G09G 2310/0202; G09G 2310/0286; G09G 2310/061; G09G 2310/08; G09G 2320/0233; G09G 2330/08; G11C 19/28
See application file for complete search history.

(56) References Cited

U.S. PATENT DOCUMENTS

| | | |
|---|---|---|
| 2010/0007635 A1* | 1/2010 | Kwon .................. G09G 3/3677 345/204 |
| 2010/0156875 A1 | 6/2010 | Kim et al. |
| 2014/0022289 A1 | 1/2014 | Lee et al. |
| 2017/0193923 A1 | 7/2017 | Park et al. |
| 2018/0090043 A1 | 3/2018 | Zhou et al. |
| 2018/0190192 A1 | 7/2018 | Kwon et al. |
| 2020/0043421 A1* | 2/2020 | Kang .................. G09G 3/3291 |

FOREIGN PATENT DOCUMENTS

| | | |
|---|---|---|
| CN | 106960658 A | 7/2017 |
| CN | 107068065 A | 8/2017 |
| CN | 107464519 A | 12/2017 |
| CN | 108269537 A | 7/2018 |
| CN | 108648716 A | 10/2018 |
| CN | 108648718 A | 10/2018 |
| CN | 108682398 A | 10/2018 |
| CN | 109166527 A | 1/2019 |
| CN | 109166529 A | 1/2019 |
| CN | 109935212 A | 6/2019 |

* cited by examiner

ELECTRONIC PANEL, DISPLAY DEVICE, AND DRIVING METHOD

CROSS-REFERENCE TO RELATED APPLICATION

The present application claims priority of the Chinese Patent Application No. 201811244287.7 filed on Oct. 24, 2018, the disclosure of which is incorporated herein by reference in its entirety as part of the present application.

TECHNICAL FIELD

The embodiments of the present disclosure relate to an electronic panel, a display device, and a driving method.

BACKGROUND

In a display field, especially in an OLED (organic light-emitting diode) electronic panel, a gate driving circuit is currently generally integrated in a GATE IC. The area of the chip in the IC design is the main factor affecting the cost of the chip. How to effectively reduce the area of the chip is a technical developer's important consideration.

At present, the gate driving circuit for the OLED electronic panel usually includes three sub-circuits, namely a detection circuit, a display circuit, and a connection circuit (or gate circuit) that outputs a composite pulse of the detection circuit and the display circuit. Such a circuit structure is very complicated and cannot meet the requirements of the high-resolution and narrow frame of the electronic panel.

SUMMARY

At least one embodiment of the present disclosure provides an electronic panel, which includes a plurality of sub-pixel units arranged in an array and a gate driving circuit, and the array includes N rows and M columns. Each sub-pixel unit among the plurality of sub-pixel units includes a light emitting unit, a pixel driving circuit configured to drive the light emitting unit to emit light, and a sensing circuit configured to sense the pixel driving circuit; the gate driving circuit includes N+1 output terminals arranged in sequence, and the gate driving circuit is configured to output gate scanning signals that turn on the N rows of the array of the plurality of sub-pixel units row by row; to pixel driving circuits of the sub-pixel units in an n-th row among the N rows are connected to an n-th output terminal among the N+1 output terminals of the gate driving circuit to receive a gate scanning signal as a scanning driving signal, and sensing circuits of the sub-pixel units in the n-th row are connected to an (n+1)-th output terminal among the N+1 output terminals of the gate driving circuit to receive a gate scanning signal as a sensing driving signal; $1 \leq n \leq N$, and N and M are integers greater than or equal to 2.

For example, in the electronic panel provided by at least one embodiment of the present disclosure, the pixel driving circuit includes a data writing circuit, a driving circuit, and a charge storage circuit. The driving circuit is connected to the data writing circuit, the charge storage circuit, the light emitting unit, and the sensing circuit, and the driving circuit is configured to control a driving current for driving the light emitting unit to emit light; the data writing circuit is further connected to the charge storage circuit, and the data writing circuit is configured to receive the scanning driving signal and to write a data signal to the driving circuit in response to the scanning driving signal; the sensing circuit is further connected to the charge storage circuit and the light emitting unit, and the sensing circuit is configured to receive the sensing driving signal, and to write a reference voltage signal to the driving circuit in response to the sensing driving signal or to read a sensing voltage signal from the driving circuit; and the charge storage circuit is further connected to the light emitting unit and is configured to store the data signal and the reference voltage signal, which are written.

For example, the electronic panel provided by at least one embodiment of the present disclosure further includes M data lines and M sensing lines. The data writing circuits of the sub-pixel units in an m-th column among the M columns are connected to an m-th data line among the M data lines to receive the data signal; the sensing circuits of the sub-pixel units in the m-th column are connected to an m-th sensing line among the M sensing lines to receive the reference voltage signal or to output the sensing voltage signal; $1 \leq m \leq M$.

For example, the electronic panel provided by at least one embodiment of the present disclosure further includes N+1 gate lines arranged in sequence, the N+1 gate lines are respectively connected to the N+1 output terminals of the gate driving circuit in one-to-one correspondence manner; the data writing circuits of the sub-pixel units in the n-th row are connected to the n-th output terminal of the gate driving circuit through an n-th gate line among the N+1 gate lines; the sensing circuits of the sub-pixel units in the n-th row are connected to the (n+1)-th output terminal of the gate driving circuit through an (n+1)-th gate line among the N+1 gate lines.

For example, in the electronic panel provided by at least one embodiment of the present disclosure, the data writing circuit includes a scanning transistor, the driving circuit includes a driving transistor, the sensing circuit includes a sensing transistor, and the charge storage circuit includes a storage capacitor. A gate electrode of the scanning transistor is configured to receive the scanning driving signal, a first electrode of the scanning transistor is configured to receive the data signal, and a second electrode of the scanning transistor is connected to a gate electrode of the driving transistor; a first electrode of the driving transistor is configured to receive a first driving voltage for generating the driving current, and a second electrode of the driving transistor is connected to a first electrode of the sensing transistor; a gate electrode of the sensing transistor is configured to receive the sensing driving signal, and a second electrode of the sensing transistor is configured to receive the reference voltage signal or output the sensing voltage signal; and a first electrode of the storage capacitor is connected to the gate electrode of the driving transistor, and a second electrode of the storage capacitor is connected to the second electrode of the driving transistor.

For example, the electronic panel provided by at least one embodiment of the present disclosure further includes N+1 gate lines arranged in sequence; the N+1 gate lines are respectively connected to the N+1 output terminals of the gate driving circuit in one-to-one correspondence manner; the pixel driving circuits of the sub-pixel units in the n-th row are connected to the n-th output terminal of the gate driving circuit through an n-th gate line among the N+1 gate lines; the sensing circuits of the sub-pixel units in the n-th row are connected to the (n+1)-th output terminal of the gate driving circuit through an (n+1)th gate line among the N+1 gate lines.

For example, in the electronic panel provided by at least one embodiment of the present disclosure, the gate driving circuit includes a plurality of shift register units which are cascaded, and each shift register unit of the plurality of shift register units includes a first sub-unit, a second sub-unit, and a blanking input sub-unit. The first sub-unit includes a first input circuit and a first output circuit, the first input circuit is configured to control a level of a first node in response to a first input signal, and the first output circuit is configured to output a shift signal and a first output signal under control of the level of the first node; the second sub-unit includes a second input circuit and a second output circuit, the second input circuit is configured to control a level of a second node in response to the first input signal, and the second output circuit is configured to output a second output signal under control of the level of the second node; and the blanking input sub-unit is connected to the first node and the second node, and is configured to receive a selection control signal and control the level of the first node and the level of the second node.

For example, in the electronic panel provided by at least one embodiment of the present disclosure, the blanking input sub-unit includes a selection control circuit, a third input circuit, a first transmission circuit, and a second transmission circuit. The selection control circuit is configured to control a level of a third node using a second input signal in response to the selection control signal and maintain the level of the third node; the third input circuit is configured to control a level of a fourth node under control of the level of the third node; the first transmission circuit is electrically connected to the first node and the fourth node, and is configured to control the level of the first node under control of the level of the fourth node or under control of a first transmission signal; and the second transmission circuit is electrically connected to the second node and the fourth node, and is configured to control the level of the second node under control of the level of the fourth node or under control of a second transmission signal.

For example, in the electronic panel provided by at least one embodiment of the present disclosure, the first sub-unit further includes a first control circuit, a first reset circuit, a second reset circuit, a shift signal output terminal, and a first output signal terminal; the second sub-unit further includes a second control circuit, a third reset circuit, a fourth reset circuit, and a second output signal terminal.

The shift signal output terminal is configured to output the shift signal, the first output signal terminal is configured to output the first output signal, the second output signal terminal is configured to output the second output signal; the first control circuit is configured to control a level of a fifth node under control of both the level of the first node and a second voltage; the first reset circuit is configured to reset the first node, the shift signal output terminal, and the first output signal terminal under control of the level of the fifth node; the second reset circuit is configured to reset the first node, the shift signal output terminal, and the first output signal terminal under control of a level of a sixth node; the second control circuit is configured to control the level of the sixth node under control of both the level of the second node and a third voltage; the third reset circuit is configured to reset the second node and the second output signal terminal under control of the level of the sixth node; and the fourth reset circuit is configured to reset the second node and the second output signal terminal under control of the level of the fifth node.

For example, in the electronic panel provided by at least one embodiment of the present disclosure, the blanking input sub-unit further includes a common reset circuit; the common reset circuit is electrically connected to the fourth node, the fifth node, and the sixth node, and is configured to reset the fourth node under control of the level of the fifth node or under control of the level of the sixth node.

For example, in the electronic panel provided by at least one embodiment of the present disclosure, the first sub-unit further includes a third control circuit and a fourth control circuit, the third control circuit is configured to control the level of the fifth node in response to a first clock signal, and the fourth control circuit is configured to control the level of the fifth node in response to the first input signal; and the second sub-unit further includes a fifth control circuit and a sixth control circuit, the fifth control circuit is configured to control the level of the sixth node in response to the first clock signal, and the sixth control circuit is configured to control the level of the sixth node in response to the first input signal.

For example, in the electronic panel provided by at least one embodiment of the present disclosure, the electronic panel is a display panel; the first sub-unit further includes a fifth reset circuit and a sixth reset circuit, the fifth reset circuit is configured to reset the first node in response to a display reset signal, and the sixth reset circuit is configured to reset the first node in response to a global reset signal; and the second sub-unit further includes a seventh reset circuit and an eighth reset circuit, the seventh reset circuit is configured to reset the second node in response to the display reset signal, and the eighth reset circuit is configured to reset the second node in response to the global reset signal.

For example, in the electronic panel provided by at least one embodiment of the present disclosure, the shift register unit further includes a common electric-leakage prevention circuit, a first electric-leakage prevention circuit, and a second electric-leakage prevention circuit. The common electric-leakage prevention circuit is electrically connected to the first node and a seventh node, and is configured to control a level of the seventh node under control of the level of the first node; the first electric-leakage prevention circuit is electrically connected to the seventh node, the first reset circuit, the second reset circuit, the fifth reset circuit, and the sixth reset circuit, and the first electric-leakage prevention circuit is configured to prevent electric leakage at the first node under control of the level of the seventh node; and the second electric-leakage prevention circuit is electrically connected to the seventh node, the third reset circuit, the fourth reset circuit, the seventh reset circuit, and the eighth reset circuit, and the second electric-leakage prevention circuit is configured to prevent electric leakage at the second node under control of the level of the seventh node.

At least one embodiment of the present disclosure further provides a display device, which includes the electronic panel according to any one of the embodiments of the present disclosure.

At least one embodiment of the present disclosure further provides a driving method of the electronic panel according to any one of the embodiments of the present disclosure, and the electronic panel is a display panel; in the driving method, a period for one frame includes a display period and a blanking period. During the display period, in each sub-pixel unit, the pixel driving circuit is configured to drive the light emitting unit to emit light; during the blanking period, an i-th row of the plurality of sub-pixel units is randomly selected from the N rows of the plurality of sub-pixel units, so that the sensing circuits in the i-th row of the plurality of sub-pixel units perform sensing; $1 \leq i \leq N$.

For example, in the driving method provided by at least one embodiment of the present disclosure, the display period includes a data writing stage, a holding stage, and a light-emitting stage; in a case where the pixel driving circuit includes a data writing circuit, a driving circuit, and a charge storage circuit, in the data writing stage, the data writing circuit and the sensing circuit are turned on, and a data signal and a reference voltage signal are respectively written through the data writing circuit and the sensing circuit; in the holding stage, the data writing circuit is turned off, the sensing circuit is turned on, and the charge storage circuit holds the data signal and the reference voltage signal; in the light-emitting stage, the data writing circuit and the sensing circuit are turned off, the driving circuit is turned on, and the driving circuit drives the light emitting unit to emit light according to the data signal.

For example, in the driving method provided by at least one embodiment of the present disclosure, the blanking period includes a reset stage, a restoring stage, a charging stage, and a sensing stage; in a case where the pixel driving circuit includes a data writing circuit, a driving circuit, and a charge storage circuit, when sensing the i-th row of the plurality of sub-pixel units, in the reset stage, the driving circuits of the sub-pixel units in an (i−1)-th row among the N rows are turned off; in the restoring stage, the data writing circuits and the sensing circuits, which are in the sub-pixel units of the i-th row, are turned on, and a data signals are respectively written through the data writing circuits and the reference voltage signals are respectively written through the sensing circuits to turn on the driving circuits of the sub-pixel units in the i-th row; in the charging stage, the data writing circuits of the sub-pixel units in the i-th row are turned off, the sensing circuits of the sub-pixel units in the i-th row are turned on, and the sensing circuits of the sub-pixel units in the i-th row are charged through the driving circuits of the sub-pixel units in the i-th row; in the sensing stage, the data writing circuits of the sub-pixel units in the i-th row are turned off, the sensing circuits of the sub-pixel units in the i-th row are turned on, and sensing voltage signals are output through the sensing circuits of the sub-pixel units in the i-th row.

For example, in the driving method provided by at least one embodiment of the present disclosure, in the reset stage, the data writing circuits and the sensing circuits, which are in the sub-pixel units of the (i−1)-th row, are turned on, and correction voltages are respectively written by the data writing circuits and the sensing circuits, which are in the sub-pixel units of the (i−1)-th row, to turn off the driving circuits of the sub-pixel units in the (i−1)-th row.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
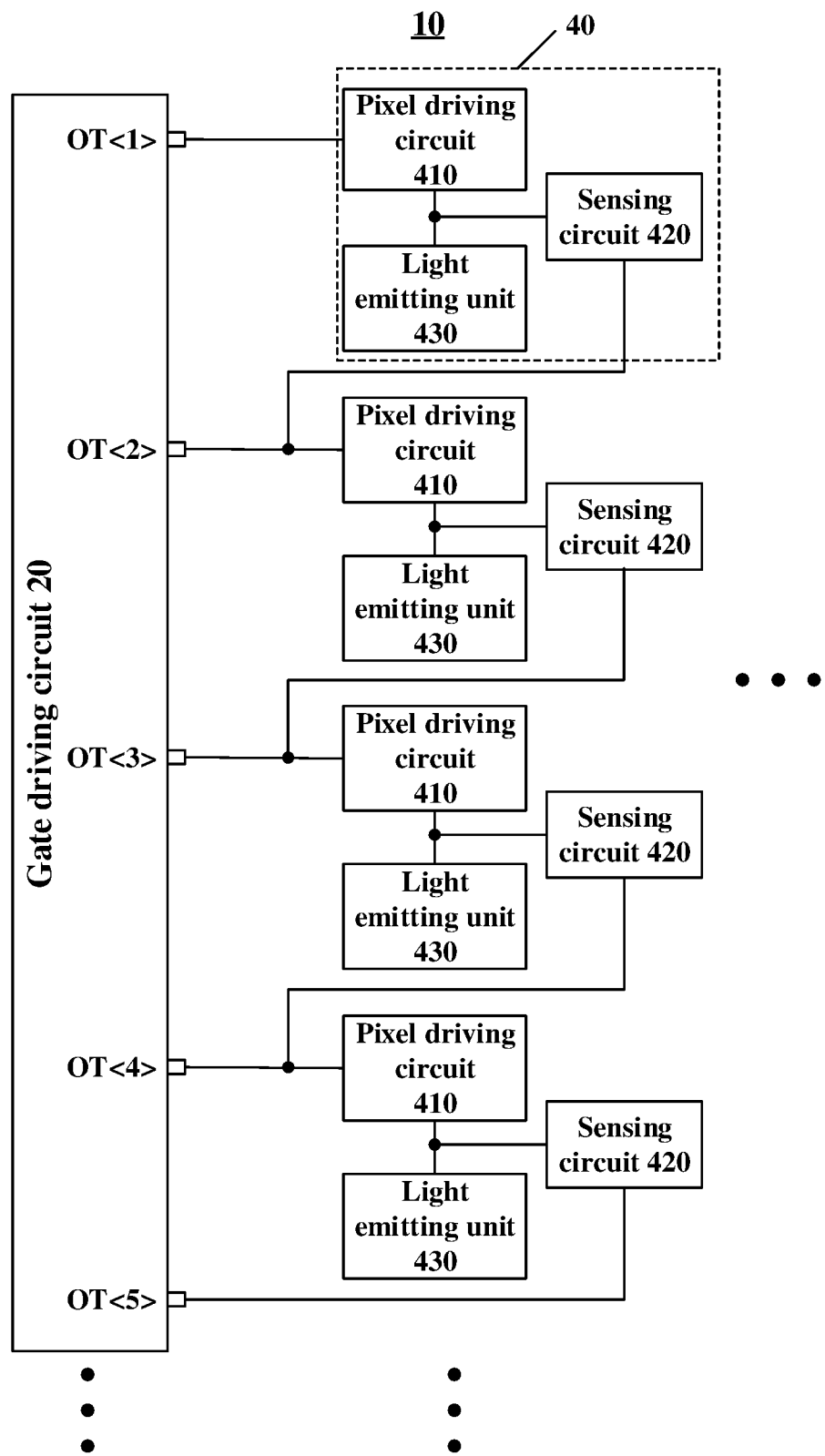
FIG. 1 is a schematic diagram of an electronic panel provided by at least one embodiment of the present disclosure.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

When compensating a sub-pixel unit in an OLED display panel, in addition to setting a pixel compensation circuit in the sub-pixel unit for internal compensation, external compensation can also be performed by setting a sensing transistor. When performing the external compensation, a gate driving circuit formed of shift register units needs to respectively provide a driving signal for a scanning transistor and a driving signal for the sensing transistor to the sub-pixel unit in the display panel; for example, a scanning driving signal for the scanning transistor is provided in a display period of one frame, and a sensing driving signal for the sensing transistor is provided in a blanking period of one frame.

In an external compensation method, the sensing driving signals output by the gate driving circuit sequentially perform scanning row by row. For example, a sensing driving signal for sub-pixel units in a first row in a display panel is output during a blanking period of a first frame, a sensing driving signal for sub-pixel units in a second row in the display panel is output during a blanking period of a second frame, and so on. The sensing driving signals are sequentially output row by row in a frequency that the sensing driving signal corresponding to the sub-pixel units in one row is output in each frame, and thus the progressive sequential compensation of the display panel is completed.

However, when using the above-mentioned progressive sequential compensation method, display defects may occur: on one hand, there is a scanning line that moves progressively during a scanning display process of multiple frames; on the other hand, a large difference in the brightness between different regions of the display panel is caused due to the difference between time points of performing the external compensation. For example, when performing the external compensation on the sub-pixel units in the 100-th row in the display panel, although the sub-pixel units in the 10-th row in the display panel have already been externally compensated, however, in this case, the luminous brightness of the sub-pixel units in the 10-th row may have already changed, for example, the luminous brightness is reduced, which may cause uneven brightness in different regions of the display panel. This phenomenon is more obvious in a large-sized display panel.

As described above, in the case where the gate driving circuit drives a plurality of rows of sub-pixel units in the display panel, in order to achieve the external compensation, the gate driving circuit is required to not only output the scanning driving signal for the display period, but also output the sensing driving signal for the blanking period. For example, for the display panel including N rows of sub-pixel units, the gate driving circuit needs to be provided with 2N output terminals. In this case, the area occupied by the gate driving circuit may be relatively large, so the size of the frame of the display device using the gate driving circuit is relatively large, and it is difficult to increase the PPI (pixels per inch) of the display device.

At least one embodiment of the present disclosure provides an electronic panel, the electronic panel includes a plurality of sub-pixel units arranged in an array and a gate driving circuit, and the array includes N rows and M columns. Each of the plurality of sub-pixel units includes a light emitting unit, a pixel driving circuit for driving the light emitting unit to emit light, and a sensing circuit for sensing the pixel driving circuit; the gate driving circuit includes N+1 output terminals arranged in sequence and the gate driving circuit is configured to output gate scanning signals that turn on the N rows of the array of the plurality of sub-pixel units row by row; the pixel driving circuits of the sub-pixel units in the n-th row are connected to the n-th output terminal of the gate driving circuit to receive the gate scanning signal which is used as a scanning driving signal, and the sensing circuits of the sub-pixel units in the n-th row are connected to the (n+1)-th output terminal of the gate driving circuit to receive the gate scanning signal which is used as a sensing driving signal; 1≤n≤N, n and m are integers greater than or equal to 2.

Embodiments of the present disclosure also provide a display device and a driving method corresponding to the above-mentioned electronic panel.

The electronic panel, the display device, and the driving method provided in the embodiments of the present disclosure enable the sub-pixel units of adjacent rows to share the gate scanning signal output by the gate driving circuit, thereby reducing the number of the output terminals of the gate driving circuit, further reducing the frame size of the display device using the gate driving circuit, and increasing the PPI of the display device. At the same time, the electronic panel and the corresponding display device can also achieve random compensation, and thus can avoid display defects such as the scanning line and uneven display brightness that are caused by progressive sequential compensation.

It should be noted that, in the embodiments of the present disclosure, the random compensation refers to an external compensation method that is different from the progressive sequential compensation; and in the random compensation, the sensing driving signal corresponding to any row of sub-pixel units in the electronic panel is, for example, output randomly during the blanking period of a certain frame. The following embodiments are the same as those described herein, and similar portions are not described again.

The electronic panel in the embodiments of the present disclosure is, for example, a display panel for display or a light source for illumination, or is used for implementing a grating function, or is a panel capable of emitting light for other use.

In addition, in the embodiments of the present disclosure, for the purpose of explanation, "one frame", "each frame", or "a certain frame" are defined to include the display period and the blanking period that are performed in sequence; for example, the gate driving circuit outputs a driving signal during the display period, and the driving signal can drive the plurality of rows of sub-pixel units in the electronic panel to complete the scanning and displaying of a complete image from the first row to the last row; during the blanking period, the gate driving circuit outputs another driving signal, and the another driving signal is used to drive the sensing transistors in a certain row of sub-pixel units in the electronic panel to complete the external compensation of the certain row of sub-pixel units.

The embodiments of the present disclosure and examples thereof will be described in detail below with reference to the drawings. The following embodiments are described by taking the case that the electronic panel is a display panel as an example. Embodiments of the present disclosure include, but are not limited to, the display panel.

Figure 2:
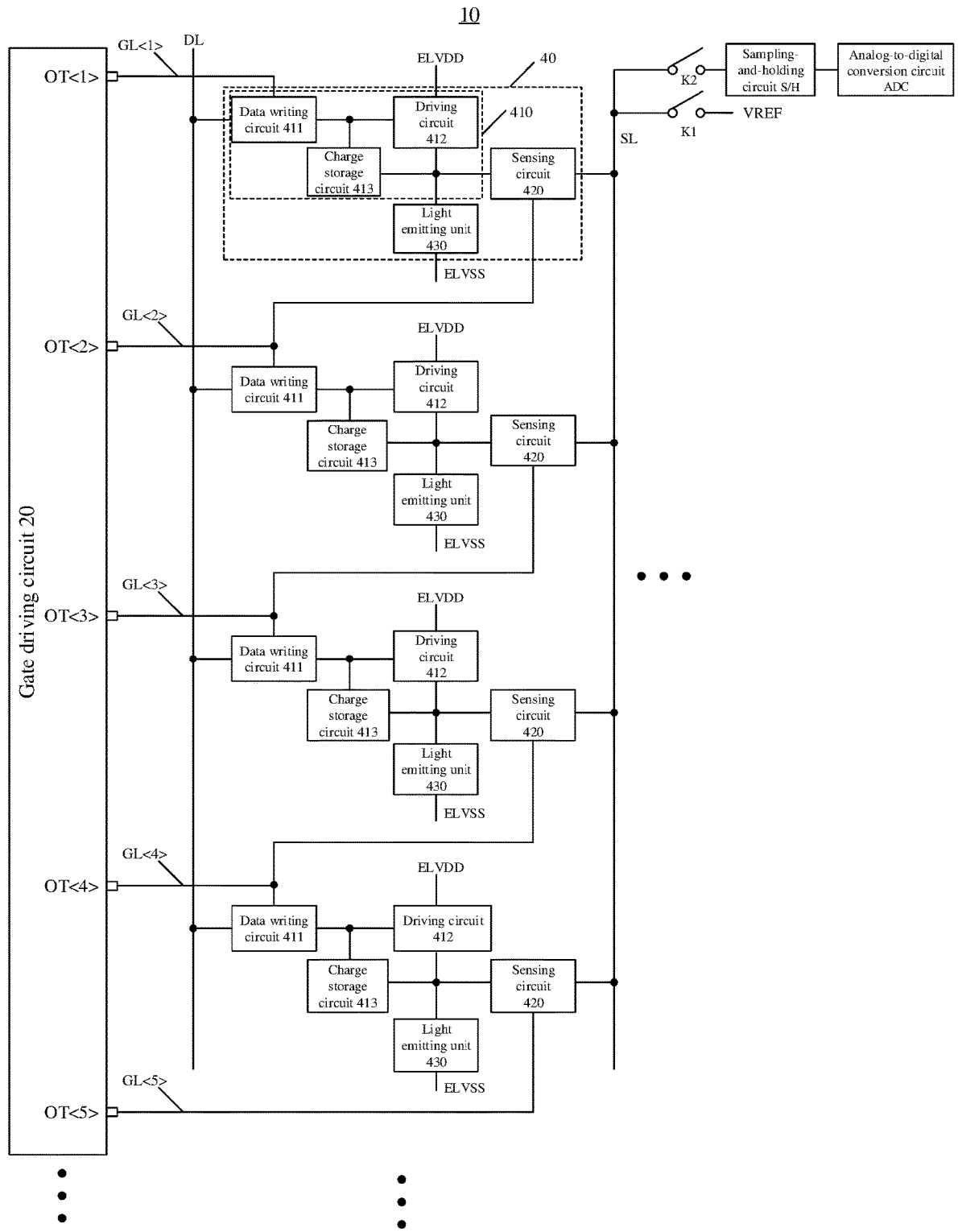
FIG. 2 is a schematic diagram of another electronic panel provided by at least one embodiment of the present disclosure.
Figure 3:
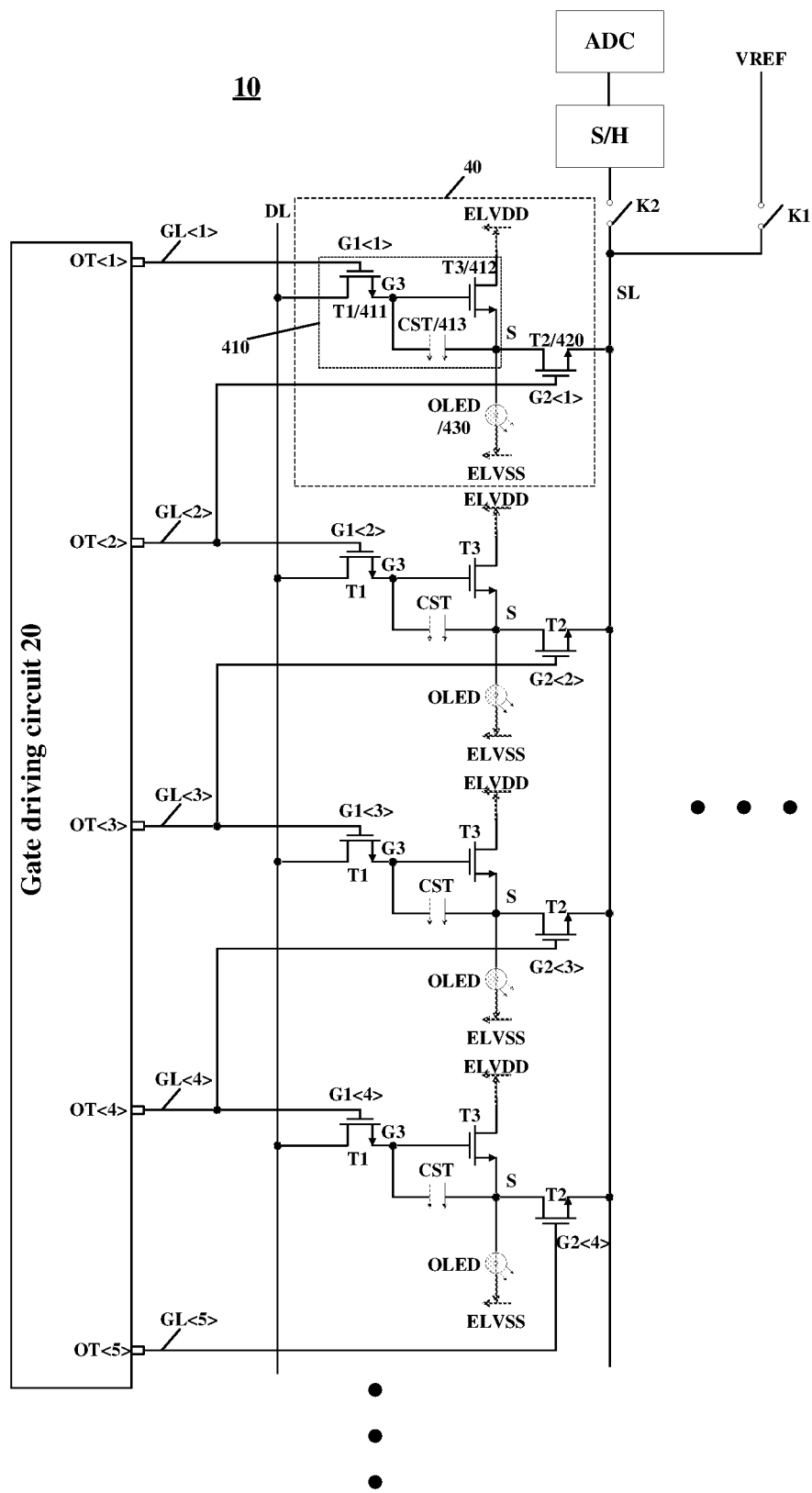
FIG. 3 is a circuit diagram of an electronic panel provided by at least one embodiment of the present disclosure.

At least one embodiment of the present disclosure provides an electronic panel (for example, the display panel) 10. As shown in FIG. 1 to FIG. 3, the electronic panel 10 includes the plurality of sub-pixel units 40 arranged in an array and the gate driving circuit 20. The array includes N rows and M columns, and N and M are integers greater than or equal to 2. It should be noted that FIG. 1 to FIG. 3 only exemplarily show 4 rows and 1 column of sub-pixel units. Embodiments of the present disclosure include, but are not limited thereto. The electronic panel 10 provided by the embodiments of the present disclosure may further include sub-pixel units 40 of more rows and more columns.

As shown in FIGS. 1 to 3, each sub-pixel unit 40 in the plurality of sub-pixel units includes a light emitting unit 430, a pixel driving circuit 410 for driving the light emitting unit 430 to emit light, and a sensing circuit 420 for sensing the pixel driving circuit 410. For example, during the display period of one frame, the pixel driving circuit 410 of the sub-pixel unit 40 can drive the light emitting unit 430 to emit light; during the blanking period of one frame, the sensing circuit 420 of the sub-pixel unit 40 can sense the pixel driving circuit 410, thereby implementing the external compensation for the sub-pixel unit 40.

For example, the gate driving circuit 20 includes N+1 output terminals OT (OT<1>, OT<2>, OT<3>, OT<4>, and OT<5>, etc.) arranged in sequence, and is configured to output the gate scanning signals that turn on the N rows of the array of the plurality of sub-pixel units row by row. For example, the gate scanning signals respectively output by the N+1 output terminals OT in the gate driving circuit 20 are continuous in time sequence, so that the N rows of the array of the plurality of sub-pixel units can be turned on row by row. It should be noted that the gate driving circuit 20 in FIG. 1 to FIG. 3 only exemplarily shows 5 output terminals. The embodiments of the present disclosure include, but are not limited thereto. The gate driving circuit 20 in the embodiments of the present disclosure can be provided with more output terminals as needed.

As shown in FIG. 1 to FIG. 3, the pixel driving circuits 410 of the sub-pixel units in the n-th row are connected to the n-th output terminal of the gate driving circuit 20 to receive the gate scanning signal as the scanning driving signal, and the sensing circuits 420 of the sub-pixel units in the n-th row are connected to the (n+1)-th output terminal of the gate driving circuit to receive the gate scanning signal as the sensing driving signal, 1≤n≤N.

For example, the pixel driving circuits 410 of the sub-pixel units in a first row are connected to a first output terminal OT<1> of the gate driving circuit 20 to receive the gate scanning signal that serves as the scanning driving signal. For example, during the display period of one frame, the scanning driving signal is used to turn on the pixel driving circuit 410. The sensing circuits 420 of the sub-pixel units in the first row are connected to a second output terminal OT<2> of the gate driving circuit to receive the gate scanning signal that serves as the sensing driving signal. For example, during the blanking period of one frame, the sensing driving signal is used to turn on the sensing circuit 420. The pixel driving circuits 410 of the sub-pixel units in a second row are connected to the second output terminal OT<2> of the gate driving circuit 20 to receive the gate scanning signal that serves as the scanning driving signal. The sensing circuits 420 of the sub-pixel units in the second row are connected to a third output terminal OT<3> of the gate driving circuit 20 to receive the gate scanning signal that serves as the sensing driving signal. The connection relationship between the sub-pixel units that are in a third row and a fourth row and the gate driving circuit 20 is similar to those described above, and will not be described again here.

As shown in FIG. 1 to FIG. 3, the plurality of rows of sub-pixel units and the gate driving circuit 20 in the electronic panel provided by the embodiments of the present disclosure adopt the connection relationship as described above, so that the sensing circuits 420 of the sub-pixel units in the n-th row and the pixel driving circuits 410 of the sub-pixel units in the (n+1)-th row are both connected to the (n+1)-th output terminal of the gate driving circuit 20. Therefore, the sensing circuits 420 of the sub-pixel units in the n-th row and the pixel driving circuits 410 of the sub-pixel units in the (n+1)-th row can share the gate scanning signal output from the (n+1)-th output terminal, thereby reducing the number of the output terminals of the gate driving circuit 20, further reducing the frame size of the display device using the electronic panel 10, and improving the PPI of the display device.

In the electronic panel 10 provided by at least one embodiment of the present disclosure, as shown in FIGS. 2 and 3, the pixel driving circuit 410 includes a data writing circuit 411, a driving circuit 412, and a charge storage circuit 413.

As shown in FIG. 2, the driving circuit 412 is connected to the data writing circuit 411, the charge storage circuit 413, the light emitting unit 430, and the sensing circuit 420. The driving circuit 412 is configured to control a driving current for driving the light emitting unit 430 to emit light. For example, in a light-emitting stage, the driving circuit 412 provides the driving current to the light emitting unit 430 to drive the light emitting unit 430 to emit light, and can emit light according to a required "gray scale".

As shown in FIGS. 2 and 3, the data writing circuit 411 is also connected to the charge storage circuit 413, and is configured to receive the scanning driving signal and to write a data signal (DATA) into the driving circuit 412 in response to the scanning driving signal. For example, taking the sub-pixel units in the first row as an example, the data writing circuit 411 is connected to the first output terminal OT<1> of the gate driving circuit 20 through a gate line GL<1> to receive the scanning driving signal, and the data writing circuit 411 is turned on in response to the scanning driving signal. For example, the data writing circuit 411 of the sub-pixel unit in the first row is connected to a data line DL to receive the data signal, and write the data signal into the driving circuit 412 in the case where the data writing circuit 411 is turned on. For example, at different stages, the data signal received by the data writing circuit 411 may be a compensated data signal driving the sub-pixel units of this current row to emit light, or may be a data signal used for driving the sub-pixel units of other row to emit light.

As shown in FIGS. 2 and 3, the sensing circuit 420 is further connected to the charge storage circuit 413 and the light emitting unit 430, and is configured to receive the sensing driving signal, and to write a reference voltage signal (VREF) into the driving circuit 412 in response to the sensing driving signal or to read a sensing voltage signal from the driving circuit 412 in response to the sensing driving signal. For example, taking the sub-pixel unit in the first row as an example, the sensing circuit 420 is connected to the second output terminal OT<2> of the gate driving circuit 20 through the gate line GL<2> to receive the sensing driving signal, and the sensing circuit 420 is turned on in response to the sensing driving signal. For example, the sensing circuit 420 of the sub-pixel unit in the first row is connected to a sensing line SL. For example, in the case where the sensing circuit 420 is turned on, the sensing circuit 420 writes the reference voltage signal VREF received by the sensing line SL into the driving circuit 412, or the sensing circuit 420 outputs the sensing voltage signal read from the driving circuit 412 through the sensing line SL.

For example, as shown in FIG. 2 and FIG. 3, the electronic panel 10 provided by the embodiments of the present disclosure further includes a sampling-and-holding circuit S/H, an analog-to-digital conversion circuit ADC, a first switch K1, and a second switch K2. For example, in the case where the reference voltage signal needs to be written through the sensing line SL, the first switch K1 is turned on and the second switch K2 is turned off. For another example, in the case where the sensing voltage signal needs to be read out through the sensing line SL, the first switch K1 is turned off and the second switch K2 is turned on.

For example, the sampling-and-holding circuit S/H is configured to sample and hold the sensing voltage signal. The analog-to-digital conversion circuit ADC is connected to the sampling-and-holding circuit S/H, and is configured to perform analog-to-digital conversion (convert an analog signal into a digital signal) on the sampled and held sensing voltage signal, to facilitate subsequent further data processing. For example, by processing the sensing voltage signal, compensation information related to a threshold voltage Vth and a current coefficient K of the driving circuit 412 is obtained. For example, during the blanking period of a certain frame, the sensing voltage signal is obtained through the sensing circuit 420, and a further data processing is performed on the sensing voltage signal to obtain the compensation information related to the threshold voltage Vth and the current coefficient K; then, during the display period of the next frame, the light emitting unit 430 is driven again according to the compensation information obtained as described above, to complete the external compensation of the sub-pixel unit 40.

For example, as shown in FIG. 2 and FIG. 3, the charge storage circuit 413 is further connected to the light emitting unit 430 and is configured to store the data signal and the reference voltage signal, which are written. For example, in the case where the data signal is written to the driving circuit 412 by the data writing circuit 411, the charge storage circuit 413 stores the data signal at the same time. For another example, in the case where the reference voltage signal is written to the driving circuit 412 by the sensing circuit 420, the charge storage circuit 413 stores the reference voltage signal at the same time.

In the electronic panel 10 provided by at least one embodiment of the present disclosure, as shown in FIG. 2 and FIG. 3, the electronic panel 10 further includes M data lines DL and M sensing lines SL. It should be noted that the number of the data lines DL and the number of the sensing lines SL included in the electronic panel 10 are the same as the number of the columns of the sub-pixel units 40 in the electronic panel 10. FIG. 2 and FIG. 3 only exemplarily show one data line DL and one sensing line SL. Embodiments of the present disclosure include, but are not limited thereto. The number of the data lines DL and the number of the sensing lines SL in the electronic panel 10 can be set as required.

For example, the pixel driving circuits 410 of the sub-pixel units in the m-th column are connected to the m-th data line DL to receive the data signal. For example, the data writing circuits 411 of the sub-pixel units in the m-th column are connected to the m-th data line DL to receive the data signal. For example, the sensing circuit 420 of the sub-pixel unit in the m-th column is connected to the m-th sensing line SL to receive the reference voltage signal or output the sensing voltage signal; $1 \leq m \leq M$.

In the electronic panel 10 provided by at least one embodiment of the present disclosure, as shown in FIG. 2 and FIG. 3, the electronic panel 10 further includes N+1 gate lines GL (GL<1>, GL<2>, GL<3>, GL<4>, GL<5>, etc.), which are sequentially arranged, and the N+1 gate lines are respectively connected to the N+1 output terminals of the gate driving circuit 20 in one-to-one correspondence manner.

For example, in the case where the electronic panel 10 includes the N rows of sub-pixel units, the gate driving circuit 20 includes N+1 output terminals OT (OT<1>, OT<2>, OT<3>, OT<4>, OT<5>, etc.), the first gate line GL<1> is connected to the first output terminal OT<1> of the gate driving circuit 20, and the second gate line GL<2> is connected to the second output terminal OT<2> of the gate driving circuit 20. By analogy, the (N+1)-th gate line GL<N+1> is connected to the (N+1)-th output terminal OT<N+1> of the gate driving circuit 20. That is, the N+1 gate lines are respectively connected to the N+1 output terminals of the gate driving circuit 20 in one-to-one correspondence manner.

For example, the pixel driving circuit 410 of the sub-pixel unit in the n-th row is connected to the n-th output terminal of the gate driving circuit through the n-th gate line. For example, the data writing circuit 411 of the sub-pixel unit in the n-th row is connected to the n-th output terminal of the gate driving circuit through the n-th gate line. For example, the sensing circuit 420 of the sub-pixel unit in the n-th row is connected to the (n+1)-th output terminal of the gate driving circuit through the (n+1)-th gate line.

As shown in FIG. 3, in the electronic panel 10 provided by at least one embodiment of the present disclosure, the sub-pixel unit 40 is implemented as a circuit structure shown in FIG. 3.

For example, the data writing circuit 411 is implemented as a scanning transistor T1, the driving circuit 412 is implemented as a driving transistor T3, the sensing circuit 420 is implemented as a sensing transistor T2, and the charge storage circuit 413 is implemented as a storage capacitor CST. The sub-pixel unit in the first row is taken as an example to describe the transistors in the sub-pixel unit 40 in detail.

A gate electrode of the scanning transistor T1 is configured to receive the scanning driving signal. For example, the gate electrode G1<1> of the scanning transistor T1 is connected to the gate line GL<1> so as to receive the scanning driving signal. A first electrode of the scanning transistor T1 is configured to receive the data signal. For example, the first electrode of the scanning transistor T1 is connected to the data line DL so as to receive the data signal. A second electrode of the scanning transistor T1 is connected to a gate electrode (G3) of the driving transistor T3.

A first electrode of the driving transistor T3 is configured to receive a driving voltage ELVDD for generating the driving current, and a second electrode (S) of the driving transistor T3 is connected to a first electrode of the sensing transistor T2.

A gate electrode G2<1> of the sensing transistor T2 is configured to receive the sensing driving signal. For example, the gate electrode G2<1> of the sensing transistor T2 is connected to the gate line GL<2> so as to receive the sensing driving signal. A second electrode of the sensing transistor T2 is configured to receive the reference voltage signal or output the sensing voltage signal. For example, the second electrode of the sensing transistor T2 is connected to the sensing line SL so as to receive the reference voltage signal (VREF) or to output the sensing voltage signal.

A first electrode of the storage capacitor CST is connected to the gate electrode (G3) of the driving transistor T3, and a second electrode of the storage capacitor CST is connected to the second electrode (S) of the driving transistor T3. The storage capacitor CST is, for example, used to maintain a voltage difference between the gate electrode (G3) and the second electrode (S) of the driving transistor T3.

For example, in the electronic panel 10 provided by the embodiments of the present disclosure, the light emitting unit 430 is implemented as an organic light-emitting diode OLED. The OLED can be of various types, such as top emission, or bottom emission, etc., and can emit red light, green light, blue light, white light, or the like, which is not limited in the embodiments of the present disclosure. In other embodiments, the light emitting unit 430 may be implemented as other types of light-emitting devices, such as a light-emitting diode (LED), a quantum dot light-emitting device, or the like.

As shown in FIG. 3, a first electrode of the light emitting unit 430 (for example, OLED) is connected to the second electrode (S) of the driving transistor T3, so as to receive the driving current of the driving transistor T3; a second electrode of the light emitting unit 430 is configured to receive a second driving voltage ELVSS. For example, in some embodiments, the second electrode of the light emitting unit 430 (for example, OLED) is configured to be grounded, and in this case, the second driving voltage ELVSS is 0V. For example, the first driving voltage ELVDD is a high-level voltage (for example, 5V, 10V, or other suitable voltage), and the second driving voltage ELVSS is a low-level voltage (for example, 0V, −5V, −10V, or other suitable voltage). In the case where the driving transistor T3 is turned on (or partially turned on), the first driving voltage ELVDD and the second driving voltage ELVSS are, for example, regarded as a power source, and the power source is used to generate the driving current for driving the light emitting unit 430.

In the electronic panel 10 provided by the embodiments of the present disclosure, the sensing transistor T2 of the sub-pixel unit in the n-th row and the scanning transistor T1 of the sub-pixel unit in the (n+1)-th row are both connected to the (n+1)-th output terminal of the gate driving circuit 20, so that the sensing transistor T2 of the sub-pixel unit in the n-th row and the scanning transistor T1 of the sub-pixel unit in the (n+1)-th row share the gate scanning signal output by the (n+1)-th output terminal, and therefore, the number of the output terminals of the gate driving circuit 20 is reduced, the frame size of the display device using the electronic panel 10 is reduced, and the PPI of the display device is increased.

In addition, the external compensation is implemented by the sensing transistor T2 in the sub-pixel unit 40. For example, during the blanking period of a certain frame, the sensing voltage signal is obtained through the sensing transistor T2, and a further data processing is performed on the sensing voltage signal to obtain the compensation information related to the threshold voltage Vth and the current coefficient K; then, during the display period of the next frame, the light emitting unit 430 is driven again according to the compensation information obtained as described above, to complete the external compensation of the sub-pixel unit 40.

The working principle of one sub-pixel unit 40 in the electronic panel (for example, the display panel) 10 shown in FIG. 3 during the display period of one frame is described below with reference to the signal timing diagram shown in FIG. 4. Here, description is given by taking the example that each transistor is an N-type transistor, but embodiments of the present disclosure are not limited thereto. The signal levels in the signal timing diagram shown in FIG. 4 are only schematic and do not represent the true level values.

Figure 4:
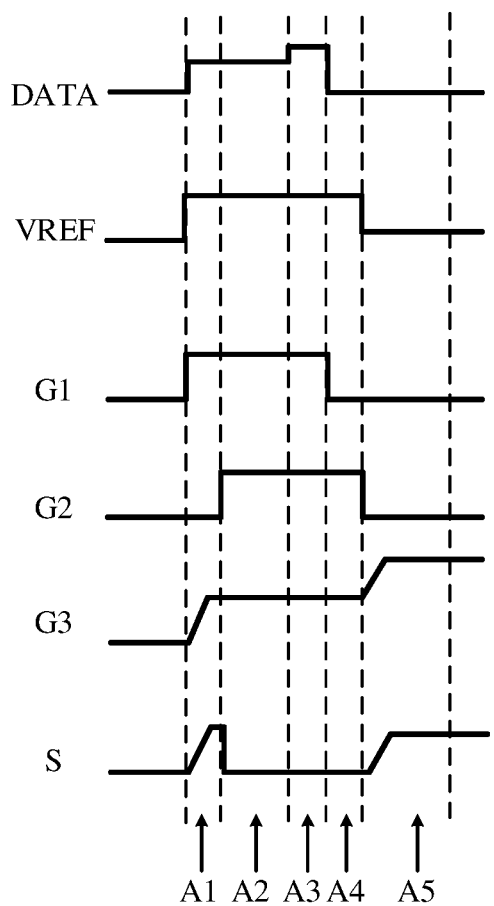
FIG. 4 is a signal timing diagram of the electronic panel shown in FIG. 3 in a case where the electronic panel operates during a display period of one frame.

In FIG. 4, DATA represents the data signal received by the sub-pixel unit 40 through the data line DL, VREF represents the reference voltage signal received by the sub-pixel unit 40 through the sensing line SL, G1 represents the gate electrode of the scanning transistor T1 in the sub-pixel unit 40, G2 represents the gate electrode of the sensing transistor T2, G3 represents the gate electrode of the driving transistor T3, and S represents the second electrode of the driving transistor T3.

As shown in FIG. 4, in an A1 stage, G1 is at a high level and the scanning transistor T1 is turned on; G2 is at a low level, and the sensing transistor T2 is turned off. At this stage, the data signal that does not belong to the present row is written through the data line DL, so the electric potential of G3 becomes high. Due to the bootstrap effect of the storage capacitor CST, the electric potential of S also becomes high at this stage.

In an A2 stage, the electric potential of G2 changes from a low level to a high level, and the sensing transistor T2 is turned on while the scanning transistor T1 remains turned on. At this stage, the data signal that does not belong to the present row is written through the data line DL, and for example, this data signal and the data signal written in the A1 stage may be the same or different; the reference voltage signal VREF is written through the sensing line SL, and for example, the reference voltage signal VREF is a low-level signal (for example, the low level is 0V).

In an A3 stage (data writing stage), G1 and G2 remain at a high level, so the scanning transistor T1 and the sensing transistor T2 remain on. At this stage, the data signal of the present row is written through the data line DL. For example, the data signal is a data signal after external compensation and used for driving the sub-pixel units in the present row to emit light. The reference voltage signal VREF is written through the sensing line SL. For example, the reference voltage signal VREF is the same as the reference voltage signal VREF written in the A2 stage.

In an A4 stage (holding stage), the electric potential of G1 changes from a high level to a low level, and the scanning transistor T1 is turned off; G2 continues to maintain a high level and the sensing transistor T2 continues to be turned on. At this stage, the storage capacitor CST maintains the electric potential of G3 and the electric potential of S unchanged.

In an A5 stage (light-emitting stage), G1 remains at a low level, and the scanning transistor T1 is turned off; the electric potential of G2 changes from a high level to a low level, and the sensing transistor T2 is turned off. At this stage, the driving transistor T3 is turned on under the combined effect of the electric potential of G3 and the electric potential of S (for example, an absolute value of the difference between the electric potential of G3 and the electric potential of S is greater than the threshold voltage Vth of the driving transistor T3), and the first driving voltage ELVDD charges the second electrode S of the driving transistor T3, that is, the light emitting unit 430 is driven to emit light. At the same time, in the case where the electric potential of S increases, the electric potential of G3 also increases due to the bootstrap effect of the storage capacitor CST.

Therefore, through the above five stages, the light emitting unit 430 (e.g., OLED) in the sub-pixel unit 40 completes light emission. It should be noted that, as shown in FIG. 4, in this example, the data signal of the present row is written into the sub-pixel unit 40 only in the last quarter of the stage (A1 stage, A2 stage, and A3 stage) when G1 is at a high level. In addition, the time when the electric potential of G1 (or G2) is at a high level is the pulse width of the gate driving signal output by the gate driving circuit 20.

Figure 5:
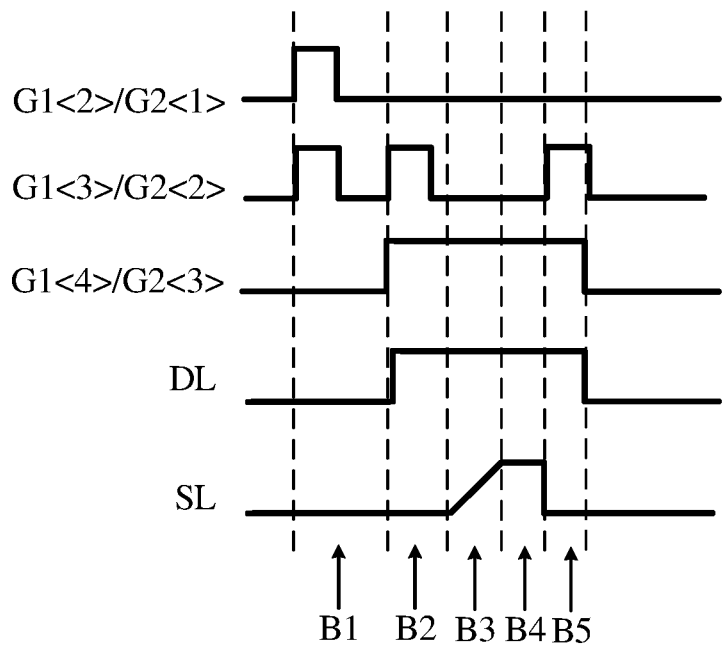
FIG. 5 is a signal timing diagram of the electronic panel shown in FIG. 3 in a case where the electronic panel operates during a blanking period of one frame.

The working principle of the electronic panel 10 shown in FIG. 3 during the blanking period of one frame will be described below with reference to the signal timing diagram shown in FIG. 5. Here, description is given by taking the case that each transistor is an N-type transistor as an example. The embodiments of the present disclosure are not limited thereto. The signal levels in the signal timing diagram shown in FIG. 5 are only schematic and do not represent true level values. For example, during the blanking period of the frame, the sub-pixel units in the third row are selected for sensing.

In FIG. 5, G1<2>/G2<1> represents the gate electrode of the scanning transistor T1 in the sub-pixel unit of the second row (the gate electrode of the sensing transistor T2 in the sub-pixel unit of the first row); G1<3>/G2<2> represents the gate electrode of the scanning transistor T1 in the sub-pixel unit of the third row (the gate electrode of the sensing transistor T2 in the sub-pixel unit of the second row); G1<4>/G2<3> represents the gate electrode of the scanning transistor T1 in the sub-pixel unit of the fourth row (the gate electrode of the sensing transistor T2 in the sub-pixel unit of the third row); DL represents the signal provided by the data line, and SL represents the signal provided by (or read out from) the sensing line.

When sensing the sub-pixel unit in the third row, first, the electric potential of the gate electrode G1<3> of the scanning transistor T1 in the sub-pixel unit of the third row and the electric potential of the gate electrode G2<3> of the sensing transistor T2 in the sub-pixel unit of the third row need to be at a high level; at the same time, because the gate electrode G2<2> of the sensing transistor T2 in the sub-pixel unit of the second row is connected to the gate electrode G1<3> of the scanning transistor T1 in the sub-pixel unit of the third row, the sensing transistor T2 in the sub-pixel unit of the second row is turned on, and a sensing error occurs. Because the sub-pixel unit in the second row is originally in the light-emitting stage, a current flows through the driving transistor T3 of the sub-pixel unit in the second row, which causes the second electrode of the driving transistor T3 to be charged; in this case, the sensing line SL also senses the sub-pixel unit in the second row when sensing the sub-pixel unit in the third row, which causes the aforementioned sensing error.

In order to avoid the above-mentioned sensing error, when sensing the sub-pixel unit in the third row, the driving transistor T3 of the sub-pixel unit in the second row needs to be turned off first.

In a B1 stage (reset stage), the driving transistor T3 of the sub-pixel unit in the second row is turned off. For example, at this stage, each of the electric potential of G1<2> and the electric potential of G2<2> is at a high level, so that the scanning transistor T1 and the sensing transistor T2, which are in the sub-pixel unit of the second row, are turned on, to write a correction electric potential to the gate electrode (G3) of the driving transistor T3 through the data line DL and the scanning transistor T1, and to write the correction electric potential to the second electrode (S) of the driving transistor T3 through the sensing line SL and the sensing transistor T2. For example, the correction electric potential is 0V, so that the driving transistor T3 of the sub-pixel unit in the second row is turned off.

In a B2 stage (restoring stage), each of the electric potential of G1<3> and the electric potential of G2<3> is at a high level, so that the scanning transistor T1 and the sensing transistor T2, which are in the sub-pixel unit of the third row, are turned on, to write the data signal (e.g., a high-level signal, for example, 3.5V) to the gate electrode (G3) of the driving transistor T3 through the data line DL and the scanning transistor T1, and to write the reference voltage signal (for example, a low-level signal, for example, 0V) to the second electrode (S) of the driving transistor T3 through the sensing line SL and the sensing transistor T2, thereby turning on the driving transistor T3 of the sub-pixel unit in the third row. It should be noted that in the B2 stage, the written data signal and the written reference voltage signal may be of constant values, which are, for example, 3.5V and 0V, respectively.

In a B3 stage (charging stage), the electric potential of G1<3> changes from a high level to a low level, so that the scanning transistor T1 of the sub-pixel unit in the third row is turned off; the electric potential of G2<3> continues to remain high, so that the sensing transistor T2 of the sub-pixel unit in the third row remains to be turned on. The driving transistor T3 of the sub-pixel unit in the third row continues to be turned on, so that the first driving voltage ELVDD charges the second electrode (S) of the driving transistor T3. For example, at this stage, the sensing line SL remains floating.

In the B3 stage, after a period of charging, the electric potential of the second electrode (S) of the driving transistor T3 remains substantially unchanged, and then in a B4 stage (sensing stage), the electric potential, namely the sensing voltage signal, of the second electrode (S) of the driving transistor T3 is sensed through the sensing line SL, that is, the sensing voltage signal is output through the sensing line SL.

In a B5 stage (data write-back stage), each of the electric potential of G1<3> and the electric potential of G2<3> is at a high level, so that the scanning transistor T1 and the sensing transistor T2, which are in the sub-pixel unit of the third row, are turned on, to write the data signal to the gate electrode (G3) of the driving transistor T3 through the data line DL and the scanning transistor T1, and to write the reference voltage signal (for example, a low-level signal, for example, 0V) to the second electrode (S) of the driving transistor T3 through the sensing line SL and the sensing transistor T2, thereby turning on the driving transistor T3 of the sub-pixel unit in the third row. For example, the data signal written in the B5 stage is the same as the data signal used in the data writing stage (A3) during the display period.

At least one embodiment of the present disclosure also provides a driving method, the driving method can be used to drive the electronic panel (for example, the display panel) 10 provided by any one of the embodiments of the present disclosure. The driving method includes a display period and a blanking period for one frame.

During the display period, in each sub-pixel unit 40, the pixel driving circuit 410 is configured to drive the light emitting unit 430 to emit light; and during the blanking period, the i-th row of the plurality of sub-pixel units are randomly selected from the N rows of the plurality of sub-pixel units, so that the sensing circuit of the sub-pixel unit in the i-th row performs sensing. N is an integer greater than or equal to 2, and $1 \leq i \leq N$.

For example, in the driving method provided by at least one embodiment of the present disclosure, the display period includes a data writing stage, a holding stage, and a light-emitting stage.

In the case where the pixel driving circuit 410 includes the data writing circuit 411, the driving circuit 412, and the charge storage circuit 413:

In the data writing stage, the data writing circuit 411 and the sensing circuit 420 are turned on, and the data signal and the reference voltage signal are respectively written through the data writing circuit 411 and the sensing circuit 420;

In the holding stage, the data writing circuit 411 is turned off, the sensing circuit 420 is turned on, and the charge storage circuit 413 holds the data signal and the reference voltage signal; and In the light-emitting stage, the data writing circuit 411 and the sensing circuit 420 are turned off, so that the driving circuit 412 is turned on, and the driving circuit 412 drives the light emitting unit 430 to emit light according to the data signal.

It should be noted that, for detailed descriptions of the foregoing data writing stage, the holding stage, and the light-emitting stage, reference may be made to the above descriptions related to the A3 stage, the A4 stage, and the A5 stage, respectively.

For example, in the driving method provided by at least one embodiment of the present disclosure, the blanking period includes the reset stage, the restoring stage, the charging stage, and the sensing stage. In the case where the pixel driving circuit 410 includes the data writing circuit 411, the driving circuit 412, and the charge storage circuit 413, sensing the sub-pixel unit in the i-th row includes the following steps:

In the reset stage, the driving circuits 412 of the sub-pixel units in the (i−1)th row are turned off;

In the restoring stage, the data writing circuits 411 and the sensing circuits 420, which are in the sub-pixel unit of the i-th row, are turned on, and the data signals are respectively written through the data writing circuits 411 and the reference voltage signals are respectively written through the sensing circuits 420 to turn on the driving circuits 412 of the sub-pixel units in the i-th row;

In the charging stage, the data writing circuits 411 of the sub-pixel units in the i-th row are turned off, so that the sensing circuit 420 of the sub-pixel unit in the i-th row is turned on, and the sensing circuit 420 is charged by the driving circuit 412;

In the sensing stage, the data writing circuits 411 of the sub-pixel units in the i-th row are turned off, the sensing circuits 420 of the sub-pixel units in the i-th row are turned on, and the sensing voltage signal is output through the sensing circuit 420.

For example, in the driving method provided by at least one embodiment of the present disclosure, in the reset stage, the data writing circuit 411 and the sensing circuit 420, which are in the sub-pixel unit of the (i−1)th row, are turned on, and correction voltages are written through the data writing circuit 411 and the sensing circuit 420, respectively, so that the driving circuit 412 of the sub-pixel unit in the (i−1)th row is turned off.

It should be noted that, for detailed descriptions of the foregoing reset stage, the restoring stage, the charging stage, and the sensing stage, reference may be made to the above descriptions related to the B1 stage, the B2 stage, the B3 stage, and the B4 stage, respectively.

In addition, regarding the technical effects of the driving method provided by the embodiments of the present disclosure, reference may be made to the corresponding descriptions in the above-mentioned embodiments of the electronic panel 10, and similar portions are not repeated here.

The gate driving circuit 20 in the electronic panel 10 according to the embodiments of the present disclosure is described in detail below. The gate driving circuit 20 can be used in a display device, and provides the gate scanning signals during a display process of a frame of picture of the display device.

Figure 6:
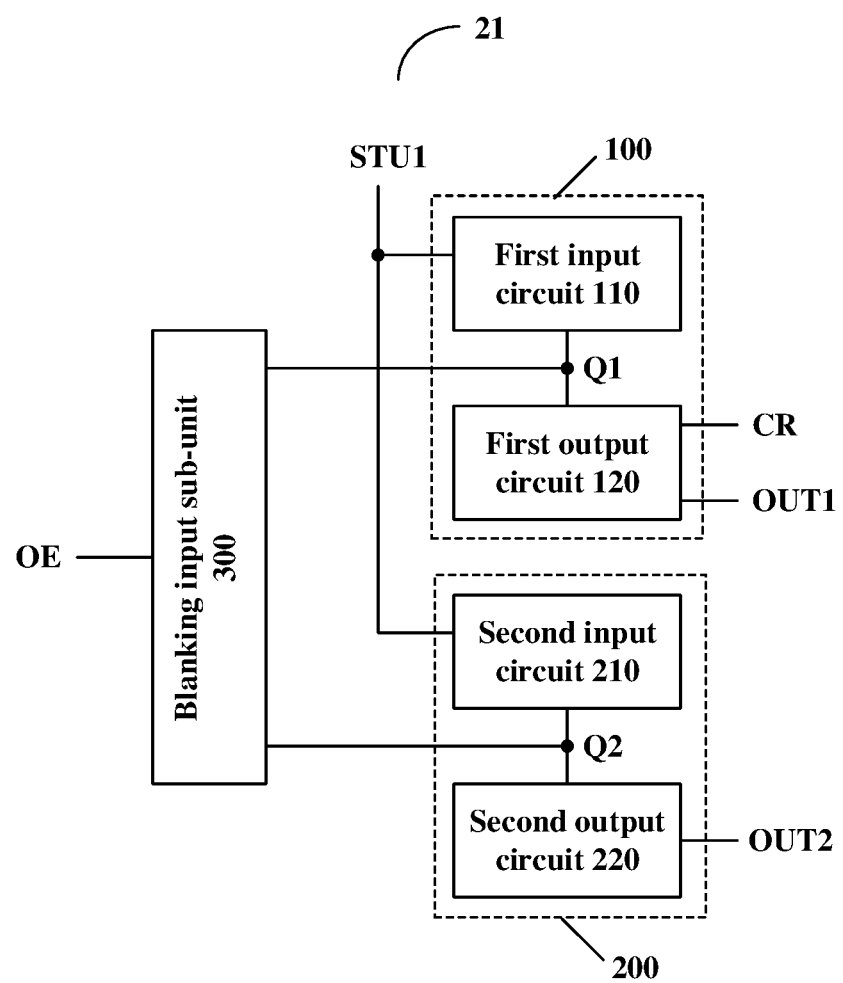
FIG. 6 is a schematic diagram of a shift register unit provided by at least one embodiment of the present disclosure.

For example, the gate driving circuit 20 includes a plurality of cascaded shift register units 21, as shown in FIG. 6, and the shift register unit 21 includes a first sub-unit 100 and a second sub-unit 200.

The first sub-unit 100 includes a first input circuit 110 and a first output circuit 120. The first input circuit 110 is configured to control a level of a first node Q1 in response to a first input signal STU1. For example, the first input circuit 110 is configured to charge the first node Q1. For example, the first input circuit 110 is configured to receive the first input signal STU1 and a first voltage VDD, and the first input circuit 110 is turned on in response to the first input signal STU1, so that the first voltage VDD can be used to charge the first node Q1.

Figure 11:
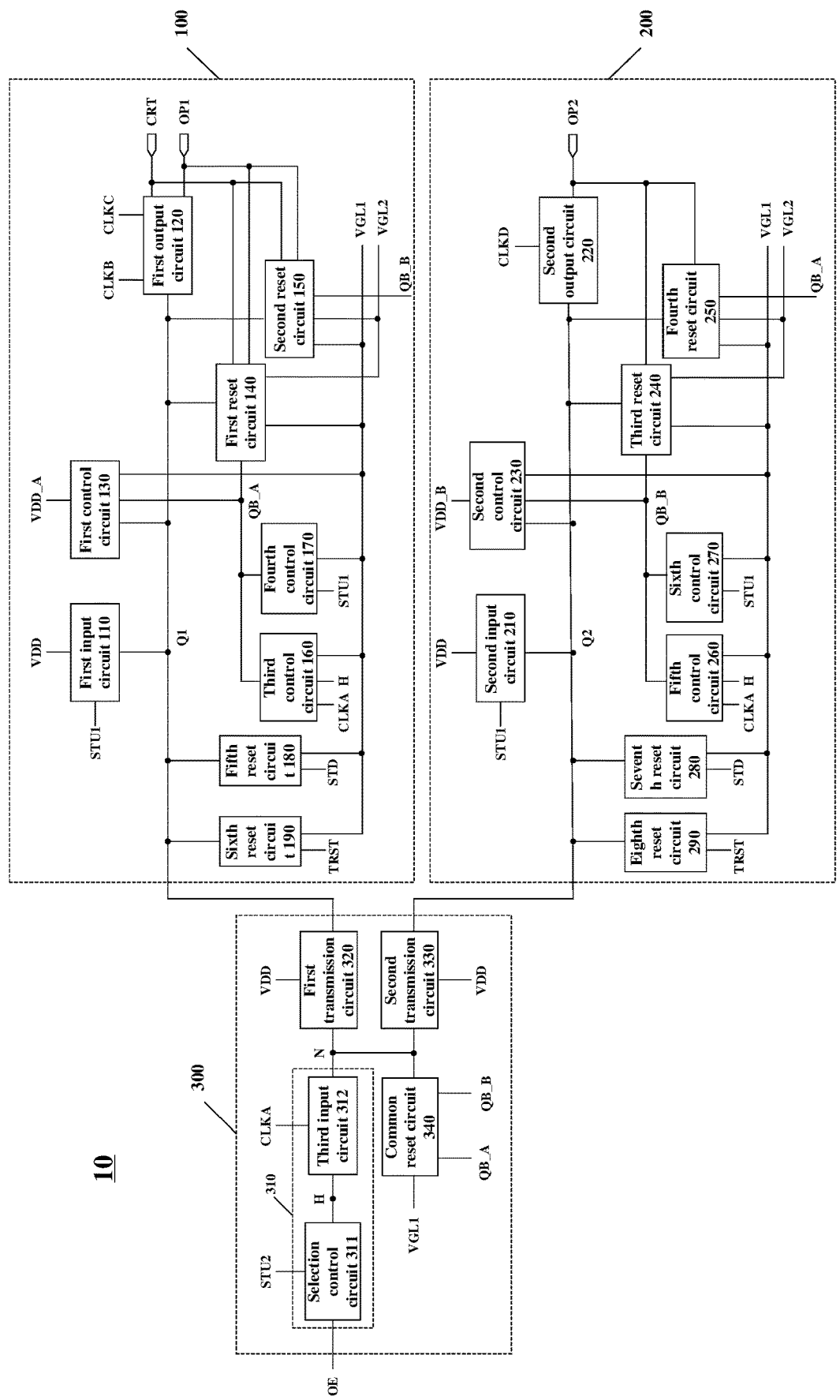
FIG. 11 is a schematic diagram of another shift register unit provided by at least one embodiment of the present disclosure.

The first output circuit 120 is configured to output a shift signal CR and a first output signal OUT1 under the control of the level of the first node Q1. For example, the first output circuit 120 is configured to receive a second clock signal CLKB and a third clock signal CLKC (as shown in FIG. 11), and in the case where the first output circuit 120 is turned on under the control of the level of the first node Q1, the first output circuit 120 outputs the second clock signal CLKB as the shift signal CR, and outputs the third clock signal CLKC as the first output signal OUT1.

For example, during the display period of one frame, the shift signal CR output by the first output circuit 120 is provided to the other shift register unit 21 and is used as the first input signal STU1 to complete the progressive shift of display scanning. The first output signal OUT1 output by the first output circuit 120 can drive a certain row of sub-pixel units in the electronic panel 10 to perform display scanning. For another example, during the blanking period of one frame, the first output signal OUT1 output by the first output circuit 120 is used to drive the sensing transistors in a certain row of sub-pixel units in the electronic panel 10, so as to complete the external compensation of the certain row of sub-pixel units.

It should be noted that, during the display period of one frame, the signal waveforms of the shift signal CR and the first output signal OUT1, which are output by the first output circuit 120, may be the same or may be different, which is not limited in the embodiments of the present disclosure.

Figure 7:
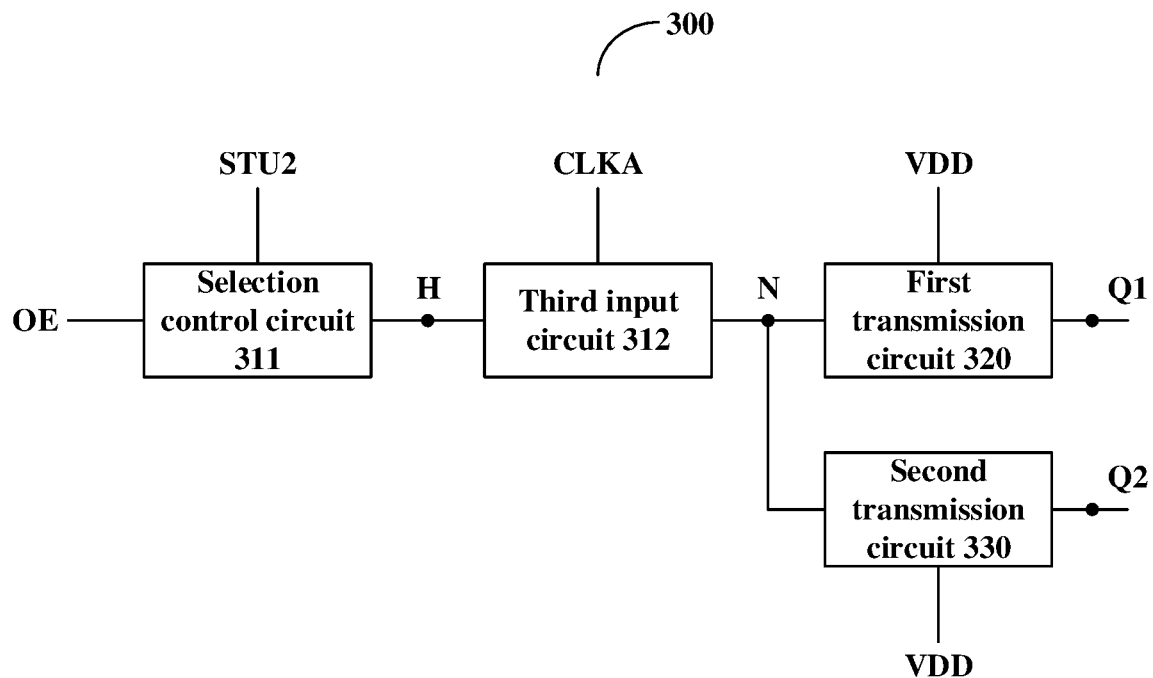
FIG. 7 is a schematic diagram of a blanking input sub-unit provided by at least one embodiment of the present disclosure.

The second sub-unit 200 includes a second input circuit 210 and a second output circuit 220. The second input circuit 210 is configured to control a level of the second node Q2 in response to the first input signal STU1. For example, the second input circuit 210 is configured to charge the second node Q2. For example, the second input circuit 210 is configured to receive the first input signal STU1 and the first voltage VDD (as shown in FIG. 7), and the second input circuit 210 is turned on in response to the first input signal STU1, so as to use the first voltage VDD to charge the second node Q2.

The second output circuit 220 is configured to output a second output signal OUT2 under the control of the level of the second node Q2. For example, the first output circuit 120 is configured to receive a fourth clock signal CLKD (as shown in FIG. 11), and in the case where the second output circuit 220 is turned on under the control of the level of the second node Q2, the second output circuit 220 outputs the fourth clock signal CLKD as the second output signal OUT2.

For example, during the display period of one frame, the second output signal OUT2 output by the second output circuit 220 drives a certain row of sub-pixel units in the electronic panel 10 to perform display scanning. For another example, during the blanking period of one frame, the second output signal OUT2 output by the second output circuit 220 is used to drive the sensing transistors in the certain row of sub-pixel units in the electronic panel 10, so as to complete the external compensation of the certain row of sub-pixel units.

For example, in the case where the plurality of shift register units 21 are cascaded to form the gate driving circuit 20, some of the shift register units 21 are connected to a clock signal line, so as to receive the first input signal STU1 provided by the clock signal line; alternatively, some of the shift register units 21 receive the shift signal CR, which is output by the other stage shift register unit 21, as the first input signal STU1.

It should be noted that, in the embodiments of the present disclosure, the first voltage VDD is, for example, a high level, and the following embodiments are the same as those described herein, and similar portions are not described again.

In addition, it should be noted that, in the embodiments of the present disclosure, the high level and the low level are relative. A high level indicates a higher voltage range (for example, the high level is 5V, 10V, or other suitable voltages), and a plurality of high levels can be the same or different. Similarly, a low level indicates a lower voltage range (for example, the low level may be 0V, −5V, −10V, or other suitable voltages), and a plurality of low levels may be the same or different. For example, the minimum value of the high level is greater than the maximum value of the low level.

It should be noted that, in the embodiments of the present disclosure, the control of the level of a node (for example, the first node Q1, the second node Q2, etc.) includes: charging the node to pull up the level of the node, or discharging the node to pull down the level of the node. For example, a capacitor that is electrically connected to the node is provided, and charging the node means charging the capacitor that is electrically connected to the node; similarly, discharging the node means discharging the capacitor that is electrically connected to the node; the capacitor can maintain the high level or low level of the node.

The shift register unit 21 provided in the embodiments of the present disclosure can charge a plurality of sub-units (the first sub-unit 100 and the second sub-unit 200, etc.) at the same time, only one sub-unit (such as the first sub-unit 100) needs to output a shift signal, and other sub-units (such as the second sub-unit 200, etc.) do not need to output a shift signal, thereby reducing the number of clock signal lines and the number of transistors, reducing the area occupied by the gate driving circuit 20 of the shift register unit 21, further reducing the frame size of the display device using the gate driving circuit 20, and increasing the PPI of the display device.

It should be noted that FIG. 6 is only an example of the present disclosure, and the number of sub-units included in the shift register unit 21 is not limited in the embodiments of the present disclosure. For example, three, four, or more sub-units may be included. The number of sub-units can be set according to the actual situation.

As shown in FIG. 6, the shift register unit 21 further includes a blanking input sub-unit 300. The blanking input sub-unit 300 is connected to the first node Q1 and the second node Q2, and is configured to receive a selection control signal OE and control the level of the first node Q1 and the level of the second node Q2. For example, the blanking input sub-unit 300 is configured to charge the first node Q1 and the second node Q2.

For example, during the blanking period of one frame, the blanking input sub-unit 300 charges the first node Q1 and the second node Q2, so that the first output circuit 120 outputs the first output signal OUT1 under the control of the level of the first node Q1, or the second output circuit 220 outputs the second output signal OUT2 under the control of the level of the second node Q2. The first output signal OUT1 or the second output signal OUT2 is, for example, used to drive the sensing transistors in a certain row of sub-pixel units in the electronic panel 10 to perform sensing, so as to complete the external compensation of the certain row of sub-pixel units.

As shown in FIG. 7, in at least one embodiment of the present disclosure, the blanking input sub-unit 300 includes a selection control circuit 311, a third input circuit 312, a first transmission circuit 320, and a second transmission circuit 330.

The selection control circuit 311 is configured to control a level of a third node H using the second input signal STU2 in response to the selection control signal OE. For example, the selection control circuit 311 is configured to charge the third node H and maintain the level of the third node H. For example, during the display period of one frame, the selection control circuit 311 is turned on under the control of the selection control signal OE, so as to charge the third node H using the second input signal STU2. For example, the level (e.g., high level) of the third node H is maintained from the display period of one frame to the blanking period of the frame.

For example, in the case where the plurality of shift register units 21 are cascaded to form the gate driving circuit 20, a certain stage shift register unit 21 receives the shift signal CR, which is output by another stage shift register unit 21, as the second input signal STU2. For example, in the case where a certain stage shift register unit 21 needs to be selected to output a driving signal during the blanking period of one frame, the timing of the waveforms of the selection control signal OE and the second input signal STU2, which are provided to the certain stage shift register unit 21, are the same, so that the selection control circuit 311 in the certain stage shift register unit 21 is turned on.

The third input circuit 312 is configured to control a level of a fourth node N under the control of the level of the third node H. For example, the third input circuit 312 is configured to receive a first clock signal CLKA. In the case where the third input circuit 312 is turned on under the control of the level of the third node H, the third input circuit 312, for example, transmits the first clock signal CLKA to the fourth node N, so as to control the level of the fourth node N. For example, during the blanking period of one frame, in the case where the first clock signal CLKA is at a high level, the third input circuit 312 transmits the high level to the fourth node N, so that the electric potential of the fourth node N becomes the high level.

The first transmission circuit 320 is electrically connected to the first node Q1 and the fourth node N, and is configured to control the level of the first node Q1 under the control of the level of the fourth node N or under the control of a first transmission signal TS1. For example, the first transmission circuit 320 charges the first node Q1. For example, in some examples, the first transmission circuit 320 receives the first voltage VDD having a high level, and in the case where the first transmission circuit 320 is turned on under the control of the level of the fourth node N, the first transmission circuit 320 uses the first voltage VDD to charge the first node Q1. For another example, in other examples, the first transmission circuit 320 is turned on under the control of the first transmission signal TS1, so as to achieve to electrically connect the fourth node N with the first node Q1, and furthermore, the third input circuit 312 is used to charge the first node Q1.

The second transmission circuit 330 is electrically connected to the second node Q2 and the fourth node N, and is configured to control the level of the second node Q2 under the control of the level of the fourth node N or under the control of a second transmission signal TS2. For example, the second transmission circuit 330 is configured to charge the second node Q2. For example, in some examples, the second transmission circuit 330 receives the first voltage VDD having a high level, and in the case where the second transmission circuit 330 is turned on under the control of the level of the fourth node N, the second transmission circuit 330 charge the second node Q2 with the first voltage VDD. For another example, in other examples, the second transmission circuit 330 is turned on under the control of the second transmission signal TS2, so as to achieve to electrically connect the fourth node N with the second node Q2, and then, the third input circuit 312 is used to charge the second node Q2.

It should be noted that, in the embodiments of the present disclosure, the first transmission signal TS1 and the second transmission signal TS2 may be the same. For example, the first transmission signal TS1 and the second transmission signal TS2 both adopt the first clock signal CLKA, which saves the clock signal lines. The first transmission signal TS1 and the second transmission signal TS2 may also use different signals to control the first transmission circuit 320 and the second transmission circuit 330, respectively. For example, in the case where it is not necessary to charge the second node Q2, the second transmission circuit 330 is turned off, so that the power consumption is reduced.

In addition, in the case where the shift register unit 21 includes three, four, or more sub-units, correspondingly, three, four, or more transmission circuits need to be provided to implement the function of the blanking input sub-unit 300.

In the embodiments of the present disclosure, in the case where the shift register unit 21 includes a plurality of sub-units (the first sub-unit 100 and the second sub-unit 200, etc.), these sub-units share one blanking input sub-unit 300, thereby reducing the area occupied by the gate driving circuit 20 using the shift register unit 21, further reducing the frame size of the display device using the gate driving circuit 20, and thereby increasing the PPI of the display device.

It should be noted that, in the embodiments of the present disclosure, the blanking input sub-unit 300 is provided in the shift register unit 21 to achieve that a driving signal can be output during the blanking period of one frame. The "blanking" in the blanking input sub-unit 300 only indicates that the blanking input sub-unit 300 is related to the blanking period in one frame, and is not limited to that the blanking input sub-unit 300 only works during the blanking period. The following embodiments are the same as those described herein, and repeated description is omitted.

As shown in FIGS. 8 and 9A-9F, in some embodiments, the selection control circuit 311 is implemented to include a first transistor M1 and a first capacitor C1. A gate electrode of the first transistor M1 is configured to receive the selection control signal OE, a first electrode of the first transistor M1 is configured to receive the second input signal STU2, and a second electrode of the first transistor M1 is connected to the third node H. For example, in the case where the selection control signal OE is a turn-on signal having a high level, the first transistor M1 is turned on, so that the second input signal STU2 can be used to charge the third node H.

A first electrode of the first capacitor C1 is connected to the third node H, and a second electrode of the first capacitor C1 is configured to receive a fourth voltage VGL1 or the first voltage VDD. The electric potential of the third node H is, for example, maintained by setting the first capacitor C1. For example, during the display period of one frame, the selection control circuit 311 charges the third node H to pull up the third node H to a high electric potential, and the first capacitor C1 maintains the high electric potential of the third node H until the blanking period of the frame. In addition, in other embodiments, the second electrode of the first capacitor C1 is connected to the fourth node N.

It should be noted that, in the embodiments of the present disclosure, the fourth voltage VGL1 is, for example, a low level, and the following embodiments are the same as those described herein, and similar portions are not described again.

Figure 8:
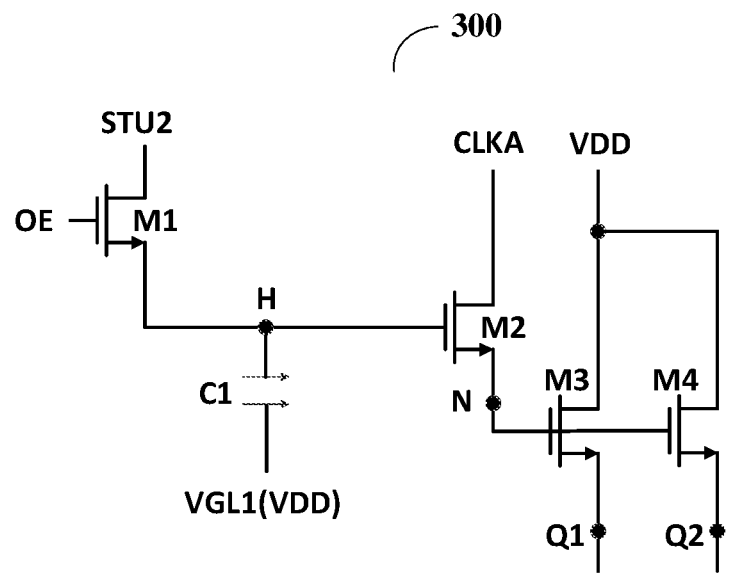
FIG. 8 is a circuit diagram of a blanking input sub-unit provided by at least one embodiment of the present disclosure.

For example, in the embodiment shown in FIG. 8, the third input circuit 312 is implemented as a second transistor M2. A gate electrode of the second transistor M2 is connected to the third node H, a first electrode of the second transistor M2 is configured to receive the first clock signal CLKA, and a second electrode of the second transistor M2 is connected to the fourth node N. For example, in the case where the third node H is at a high level, the second transistor M2 is turned on, so as to transmit the first clock signal CLKA to the fourth node N to pull up the level of the fourth node N.

For example, in the embodiment shown in FIG. 8, the first transmission circuit 320 includes a third transistor M3, and the second transmission circuit 330 includes a fourth transistor M4.

A gate electrode of the third transistor M3 is connected to the fourth node N, a first electrode of the third transistor M3 is configured to receive the first voltage VDD, and a second electrode of the third transistor M3 is connected to the first node Q1. For example, in the case where the fourth node N is at a high level, the third transistor M3 is turned on, so as to charge the first node Q1 by the high-level first voltage VDD.

A gate electrode of the fourth transistor M4 is connected to the fourth node N, a first electrode of the fourth transistor M4 is configured to receive the first voltage VDD, and a second electrode of the fourth transistor M4 is connected to the second node Q2. For example, in the case where the fourth node N is at a high level, the fourth transistor M4 is turned on, so as to charge the second node Q2 by the first voltage VDD that is at a high level.

The blanking input sub-unit 300 provided in FIGS. 9A-9F is described below. It should be noted that, in the following description, the same parts of FIGS. 9A-9F and FIG. 8 are not described again.

Figure 9A:
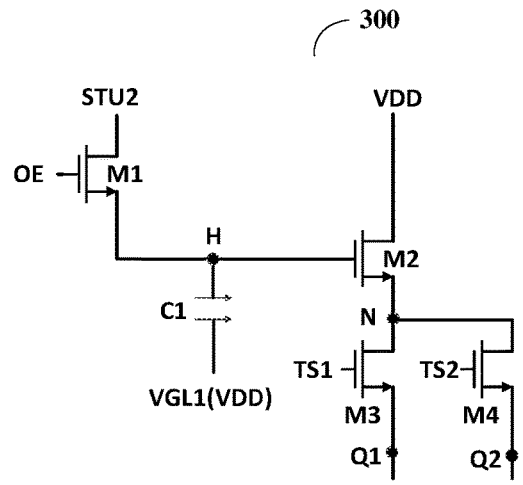
FIG. 9A to FIG. 9F are circuit diagrams of six types of blanking input sub-units provided by the embodiments of the present disclosure.

For example, in the blanking input sub-unit 300 provided in FIG. 9A, the first electrode of the second transistor M2 is configured to receive the first voltage VDD; the gate electrode of the third transistor M3 is configured to receive the first transmission signal TS1, and the first electrode of the third transistor M3 is connected to the fourth node N; the gate electrode of the fourth transistor M4 is configured to receive the second transmission signal TS2, and the first electrode of the fourth transistor M4 is connected to the fourth node N. For example, during the blanking period of one frame, in the case where the first node Q1 needs to be charged, the first transmission signal TS1 may be at a high level, so that the third transistor M3 is turned on, and that the first voltage with a high level charges the first node Q1 through the second transistor M2 and the third transistor M3. For another example, during the blanking period of one frame, in the case where the second node Q2 needs to be charged, the second transmission signal TS2 is at a high level, so that the fourth transistor M4 is turned on, and the first voltage VDD with high level charges the second node Q2 through the second transistor M2 and the fourth transistor M4.

Figure 9B:
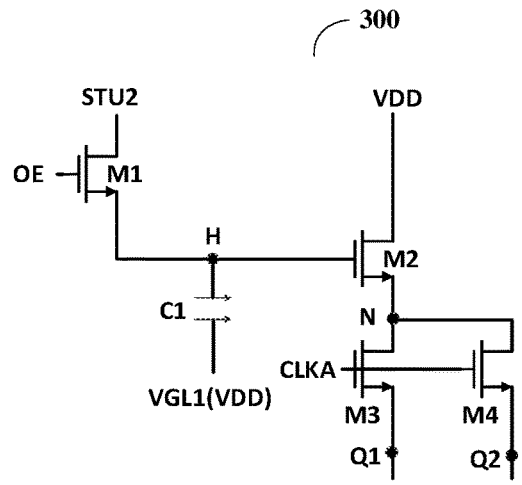

For example, in the blanking input sub-unit 300 provided in FIG. 9B, the gate electrode of the third transistor M3 and the gate electrode of the fourth transistor M4 are both configured to receive the first clock signal CLKA. For example, during the blanking period of one frame, in the case where the first clock signal CLKA is at a high level, the third transistor M3 and the fourth transistor M4 are turned on at the same time, and the first voltage VDD with a high level charges the first node Q1 and the second node Q2 at the same time.

Figure 9C:
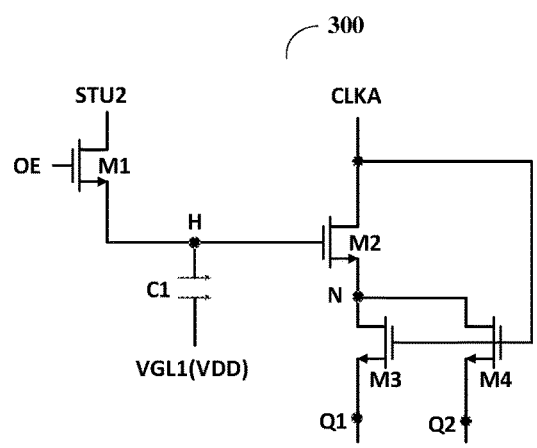

For example, as shown in FIG. 9C, the blanking input sub-unit 300 provided in FIG. 9C is different from the blanking input sub-unit 300 provided in FIG. 9B in that the first electrode of the second transistor M2 is configured to receive the first clock signal CLKA. Compared with the case that the first electrode of the second transistor M2 in FIG. 9B always receives the first voltage VDD with a high level, the second transistor M2 in FIG. 9C reduces the time when the first electrode of the second transistor M2 is applied with a high level, thereby extending the service life of the second transistor M2 and ensuring the stability of the shift register unit 21.

Figure 9D:
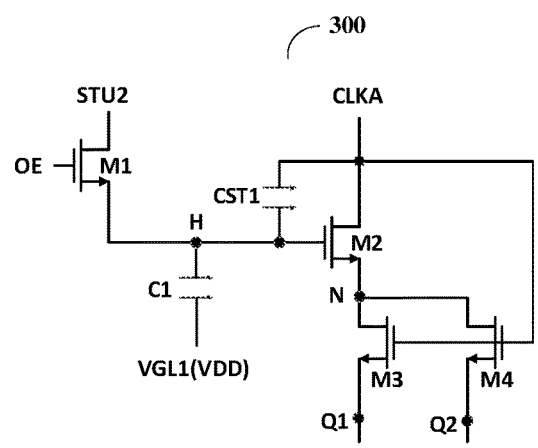

For example, as shown in FIG. 9D, compared with FIG. 9C, the blanking input sub-unit 300 further includes a first coupling capacitor CST1. A first electrode of the first coupling capacitor CST1 is configured to receive the first clock signal CLKA, and a second electrode of the first coupling capacitor CST1 is connected to the third node H. For example, in the case where the first clock signal CLKA changes from a low level to a high level, the first clock signal CLKA can pull up the third node H through the coupling effect of the first coupling capacitor CST1, so that the level of the third node H is further pulled up, thereby ensuring that the second transistor M2 is turned on more fully.

Figure 9E:
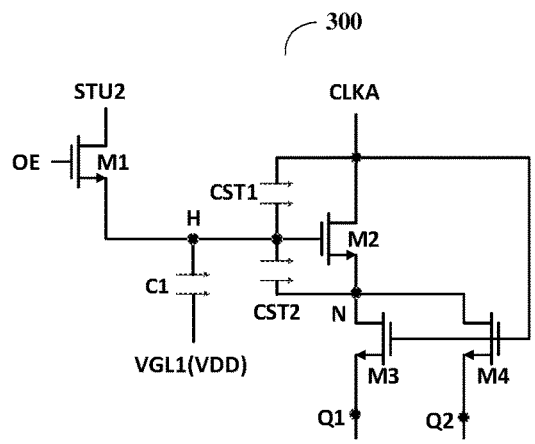

For example, as shown in FIG. 9E, compared with FIG. 9D, the blanking input sub-unit 300 further includes a second coupling capacitor CST2, a first electrode of the second coupling capacitor CST2 is connected to the third node H, and a second electrode of the second coupling capacitor CST2 is connected to the fourth node N. For example, in the case where the first clock signal CLKA changes from a low level to a high level, if the second transistor M2 is turned on at this time, the first clock signal CLKA with a high level is transmitted to the fourth node N through the second transistor M2, so that the electric potential of the second electrode of the second coupling capacitor CST2 is pulled up, and thus the level of the third node H is further pulled up through the bootstrap effect, thereby ensuring that the second transistor M2 is turned on more fully.

Figure 9F:
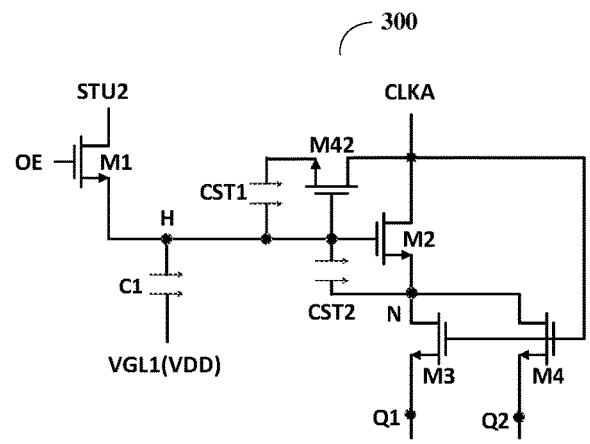

For example, as shown in FIG. 9F, compared with FIG. 9E, the blanking input sub-unit 300 further includes a forty-second transistor M42, a gate electrode of the forty-second transistor M42 is connected to the third node H, a first electrode of the forty-second transistor M42 is configured to receive the first clock signal CLKA, and a second electrode of the forty-second transistor M42 is connected to the first electrode of the first coupling capacitor CST1. For example, in the case where the third node H is at a high level, the forty-second transistor M42 is turned on, and the first clock signal CLKA can pull up the third node H through the coupling effect of the first coupling capacitor CST1, so that the level of the third node H is further pulled up, thereby ensuring that the second transistor M2 is turned on more fully.

Figure 10:
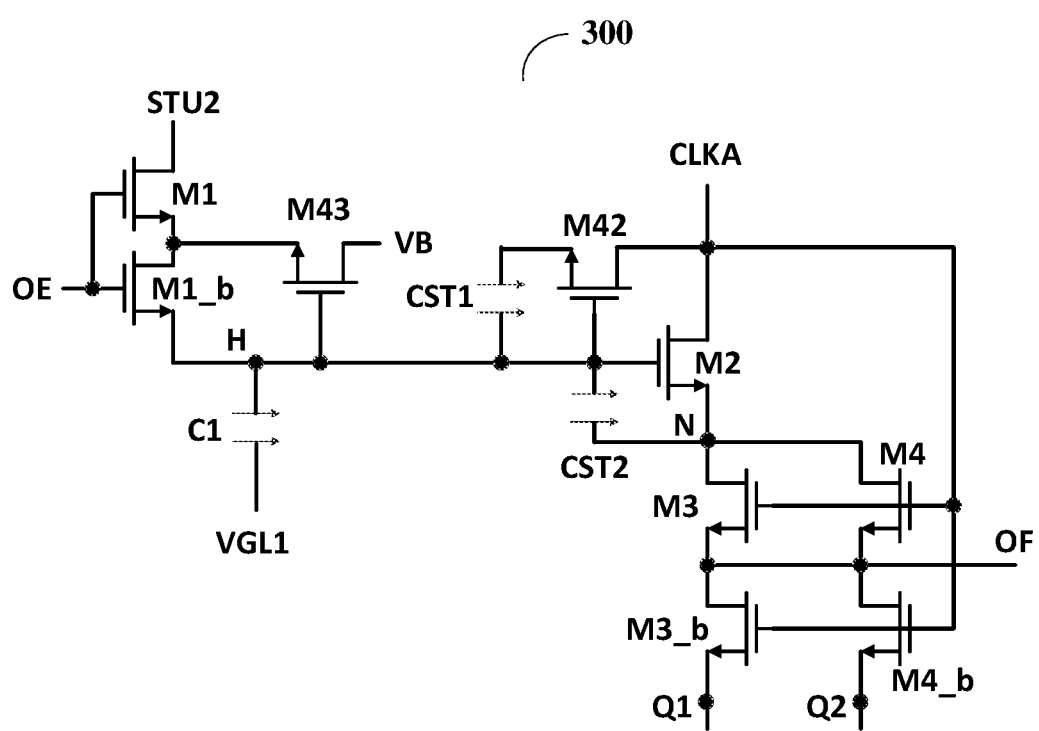
FIG. 10 is a circuit diagram of a blanking input sub-unit having an electric-leakage prevention structure provided by at least one embodiment of the present disclosure.

For example, FIG. 10 also provides a blanking input sub-unit 300. Compared with FIG. 9E, the blanking input sub-unit 300 further includes a forty-third transistor M43 and transistors M1_b, M3_b, and M4_b.

As shown in FIG. 10, a gate electrode of the forty-third transistor M43 is connected to the third node H, a first electrode of the forty-third transistor M43 is configured to receive a sixth voltage VB, and a second electrode of the forty-third transistor M43 is connected to the second electrode of the first transistor M1; a gate electrode of the transistor M1_b is configured to receive the selection control signal OE, a first electrode of the transistor M1_b is connected to the second electrode of the first transistor M1, and a second electrode of the transistor M1_b is connected to the third node H; a gate electrode of the transistor M3_b and a gate electrode of the transistor M4_b are configured to receive the first clock signal CLKA, a first electrode of the transistor M3_b and a first electrode of the transistor M4_b are connected to a seventh node OF, a second electrode of the transistor M3_b is connected to the first node Q1, and a second electrode of the transistor M4_b is connected to the second node Q2.

The forty-third transistor M43 and the transistor M1_b cooperate to prevent the third node H from generating electric leakage, the transistor M3_b can prevent the first node Q1 from generating electric leakage, and the transistor M4_b can prevent the second node Q2 from generating electric leakage. The working principle of the electric-leakage prevention in FIG. 10 and the seventh node OF will be described in detail below, and will not be repeated here.

It should be noted that, in the embodiments of the present disclosure, the sixth voltage VB is, for example, a high level. The following embodiments are the same as those described herein, and similar portions will not be described again.

In addition, it should be noted that the transistors in the blanking input sub-unit 300 provided in FIGS. 8, 9A-9F, and 10 are all described by taking N-type transistors as an example.

At least one embodiment of the present disclosure further provides a shift register unit 21. As shown in FIG. 11, the first sub-unit 100 further includes a first control circuit 130, a first reset circuit 140, a second reset circuit 150, a shift signal output terminal CRT, and a first output signal terminal OP1. The shift signal output terminal CRT is configured to output the shift signal CR, the first output signal terminal OP1 (one of the N+1 output terminals included in the gate driving circuit) is configured to output the first output signal OUT1.

The first control circuit 130 is configured to control a level of a fifth node QB_A under the control of the level of the first node Q1 and under the control of a second voltage VDD_A. For example, the first control circuit 130 is connected to the first node Q1 and the fifth node QB_A, and is configured to receive the second voltage VDD_A and the fourth voltage VGL1. For example, in the case where the first node Q1 is at a high level, the first control circuit 130 pulls down the fifth node QB_A to a low level by using the fourth voltage VGL1 with a low level. For another example, in the case where the electric potential of the first node Q1 is at a low level, the first control circuit 130 uses the second voltage VDD_A (for example, a high level) to charge the fifth node QB_A to pull up the fifth node QB_A to a high level.

The first reset circuit 140 is configured to reset the first node Q1, the shift signal output terminal CRT, and the first output signal terminal OP1 under the control of the level of the fifth node QB_A. For example, the first reset circuit 140 is connected to the first node Q1, the fifth node QB_A, the shift signal output terminal CRT, and the first output signal terminal OP1, and is configured to receive the fourth voltage VGL1 and a fifth voltage VGL2. For example, in the case where the first reset circuit 140 is turned on under the control of the level of the fifth node QB_A, the fourth voltage VGL1 is used to pull down and reset the first node Q1 and the shift signal output terminal CRT, and at the same time, the fifth voltage VGL2 is used to pull down and reset the first output signal terminal OP1. It should be noted that in the embodiments of the present disclosure, the fourth voltage VGL1 is, for example, used to pull down and reset the first output signal terminal OP1, which is not limited in the present disclosure. In addition, in the embodiments of the present disclosure, the fifth voltage VGL2 is, for example, a low level, and the following embodiments are the same as those described herein, and similar portions will not be described again. In the embodiments of the present disclosure, the fifth voltage VGL2 may be the same as or different from the fourth voltage VGL1.

The second reset circuit 150 is configured to reset the first node Q1, the shift signal output terminal CRT, and the first output signal terminal OP1 under the control of a level of a sixth node QB_B. For example, the second reset circuit 150 is connected to the first node Q1, the sixth node QB_B, the shift signal output terminal CRT, and the first output signal terminal OP1, and is configured to receive the fourth voltage VGL1 and the fifth voltage VGL2. For example, in the case where the second reset circuit 150 is turned on under the control of the level of the sixth node QB_B, the fourth voltage VGL1 is used to pull down and reset the first node Q1 and the shift signal output terminal CRT, and at the same time, the fifth voltage VGL2 is used to pull down and reset the first output signal terminal OP1.

As shown in FIG. 11, the second sub-unit 200 further includes a second control circuit 230, a third reset circuit 240, a fourth reset circuit 250, and a second output signal terminal OP2 (another one of the N+1 output terminals included in the gate driving circuit). The second output signal terminal OP2 is configured to output the second output signal OUT2.

The second control circuit 230 is configured to control the level of the sixth node QB_B under the control of the level of the second node Q2 and a third voltage VDD_B. For example, the second control circuit 230 is connected to the second node Q2 and the sixth node QB_B, and is configured to receive the third voltage VDD_B and the fourth voltage VGL1. For example, in the case where the second node Q2 is at a high level, the second control circuit 230 uses the fourth voltage VGL1 with a low level to pull down the sixth node QB_B to a low level. For another example, in the case where the electric potential of the second node Q2 is at a low level, the second control circuit 230 uses the third voltage VDD_B (for example, a high level) to charge the sixth node QB_B to pull up the sixth node QB_B to a high level.

The third reset circuit 240 is configured to reset the second node Q2 and the second output signal terminal OP2 under the control of the level of the sixth node QB_B. For example, the third reset circuit 240 is connected to the second node Q2, the sixth node QB_B, and the second output signal terminal OP2, and is configured to receive the fourth voltage VGL1 and the fifth voltage VGL2. For example, in the case where the third reset circuit 240 is turned on under the control of the level of the sixth node QB_B, the second node Q2 is pulled down and reset by the fourth voltage VGL1, and at the same time, the second output signal terminal OP2 is pulled down and reset by the fifth voltage VGL2. It should be noted that, in the embodiments of the present disclosure, the fourth voltage VGL1 can also be used to pull down and reset the second output signal terminal OP2, which is not limited in the present disclosure.

The fourth reset circuit 250 is configured to reset the second node Q2 and the second output signal terminal OP2 under the control of the level of the fifth node QB_A. For example, the fourth reset circuit 250 is connected to the second node Q2, the fifth node QB_A, and the second output signal terminal OP2, and is configured to receive the fourth voltage VGL1 and the fifth voltage VGL2. For example, in the case where the fourth reset circuit 250 is turned on under the control of the level of the fifth node QB_A, the fourth voltage VGL1 is used to pull down and reset the second node Q2, and at the same time, the fifth voltage VGL2 is used to pull down and reset the second output signal terminal OP2.

It should be noted that, in the embodiments of the present disclosure, for example, the second voltage VDD_A and the third voltage VDD_B are configured to be mutually inverted signals, that is, in the case where the second voltage VDD_A is at a high level, the third voltage VDD_B is at a low level; and in the case where the second voltage VDD_A is at a low level, the third voltage VDD_B is at a high level. In this way, only one of the first control circuit 130 and the second control circuit 230 is in an operating state at the same time, which avoids performance drift caused by the long-time operation of the circuit, thereby improving the stability of the circuit.

As shown in FIG. 11, the blanking input sub-unit 300 further includes a common reset circuit 340. The common reset circuit 340 is electrically connected to the fourth node N, the fifth node QB_A, and the sixth node QB_B, and is configured to reset the fourth node N under the control of the level of the fifth node QB_A or the control of the level of the sixth node QB_B. For example, the common reset circuit 340 is configured to receive the fourth voltage VGL1, and in the case where the common reset circuit 340 is turned on under the control of the level of the fifth node QB_A or the control of the level of the sixth node QB_B, the fourth voltage VGL1 is used to pull down and reset the fourth node N.

In the embodiments of the present disclosure, by setting the common reset circuit 340, the level of the fourth node N can be better controlled. For example, in the case where it is not necessary to charge the first node Q1 or the second node Q2, the fourth node N is at a low level, and the first transmission circuit 320 and the second transmission circuit 330 are turned off, so as to prevent the first voltage VDD with a high level from charging the first node Q1 or the second node Q2, which prevents occurrence of abnormal output, and thereby improving the stability of the circuit.

It should be noted that, in the embodiments of the present disclosure, each node (the first node Q1, the second node Q2, the third node H, the fourth node N, the fifth node QB_A, the sixth node QB_B, etc.) and each output terminal (the shift signal output terminal CRT, the first output signal terminal OP1, and the second output signal terminal OP2, etc.) are all provided to better describe the circuit structure, and do not indicate actual components. A node represents a meeting point where related circuits are connected in a circuit structure, that is, the related circuits having the same node identifier are electrically connected to each other. For example, as shown in FIG. 11, the first control circuit 130, the first reset circuit 140, the fourth reset circuit 250, and the common reset circuit 340 are all connected to the fifth node QB_A, which means that these circuits are electrically connected to each other.

At least one embodiment of the present disclosure further provides the shift register unit 21. As shown in FIG. 11, in the shift register unit 21, the first sub-unit 100 further includes a third control circuit 160 and a fourth control circuit 170. The third control circuit 160 is configured to control the level of the fifth node QB_A in response to the first clock signal CLKA, and the fourth control circuit 170 is configured to control the level of the fifth node QB_A in response to the first input signal STU1.

For example, in at least one example, the third control circuit 160 is connected to the fifth node QB_A, and is configured to receive the first clock signal CLKA and the fourth voltage VGL1. For example, during the blanking period of one frame, the third control circuit 160 is turned on in response to the first clock signal CLKA, so as to pull down the fifth node QB_A by the fourth voltage VGL1 with a low level. For example, in at least another example, the third control circuit 160 is also connected to the third node H. For example, during the blanking period of one frame, in the case where the third node H is at a high level and the first clock signal CLKA is at a high level, the third control circuit 160 is turned on, so that the fourth voltage VGL1 with a low level is used to pull down the fifth node QB_A.

For example, the fourth control circuit 170 is connected to the fifth node QB_A, and is configured to receive the first input signal STU1 and the fourth voltage VGL1. For example, during the display period of one frame, the fourth control circuit 170 is turned on in response to the first input signal STU1, so as to pull down the fifth node QB_A by using the fourth voltage VGL1 with a low level. Pulling down the fifth node QB_A to a low electric potential can avoid the influence of the fifth node QB_A on the first node Q1, so that the first node Q1 is more fully charged during the display period.

As shown in FIG. 11, the second sub-unit 200 further includes a fifth control circuit 260 and a sixth control circuit 270. The fifth control circuit 260 is configured to control the level of the sixth node QB_B in response to the first clock signal CLKA. The sixth control circuit 270 is configured to control the level of the sixth node QB_B in response to the first input signal STU1.

For example, in at least one example, the fifth control circuit 260 is connected to the sixth node QB_B, and is configured to receive the first clock signal CLKA and the fourth voltage VGL1. For example, during the blanking period of one frame, the fifth control circuit 260 is turned on in response to the first clock signal CLKA, so as to pull down the sixth node QB_B by using the fourth voltage VGL1 with a low level. For example, in at least another example, the fifth control circuit 260 is also connected to the third node H. For example, during the blanking period of one frame, in the case where the third node H is at a high level and the first clock signal CLKA is at a high level, the fifth control circuit 260 is turned on, so that the fourth voltage VGL1 with a low level is used to pull down the sixth node QB_B.

For example, the sixth control circuit 270 is connected to the sixth node QB_B, and is configured to receive the first input signal STU1 and the fourth voltage VGL1. For example, during the display period of one frame, the sixth control circuit 270 is turned on in response to the first input signal STU1, so as to pull down the sixth node QB_B by using the fourth voltage VGL1 with a low level. Pulling down the sixth node QB_B to a low electric potential can avoid the influence of the sixth node QB_B on the second node Q2, so that the second node Q2 is more fully charged during the display period.

As shown in FIG. 11, the first sub-unit 100 further includes a fifth reset circuit 180 and a sixth reset circuit 190. The fifth reset circuit 180 is configured to reset the first node Q1 in response to the display reset signal STD. The sixth reset circuit 190 is configured to reset the first node Q1 in response to a global reset signal TRST.

For example, the fifth reset circuit 180 is connected to the first node Q1 and is configured to receive the display reset signal STD and the fourth voltage VGL1. For example, during the display period of one frame, the fifth reset circuit 180 is turned on in response to the display reset signal STD, so that the fourth voltage VGL1 is used to pull down and reset the first node Q1. For example, in the case where the plurality of shift register units 21 are cascaded to form the gate driving circuit 20, a certain stage shift register unit 21 receives the shift signal CR, which is output by the another stage shift register unit 21 and is used as the display reset signal STD.

For example, the sixth reset circuit 190 is connected to the first node Q1 and is configured to receive the global reset signal TRST and the fourth voltage VGL1. For example, in the case where the plurality of shift register units 21 are cascaded to form the gate driving circuit 20, before the display period of one frame, the sixth reset circuit 190 in each stage shift register unit 21 is turned on in response to the global reset signal TRST, so that the fourth voltage VGL1 with a low level is used to pull down and reset the first node Q1, thereby achieving a global reset of the gate driving circuit 20.

As shown in FIG. 11, the second sub-unit 200 further includes a seventh reset circuit 280 and an eighth reset circuit 290. The seventh reset circuit 280 is configured to reset the second node Q2 in response to the display reset signal STD. The eighth reset circuit 290 is configured to reset the second node Q2 in response to the global reset signal TRST.

For example, the seventh reset circuit 280 is connected to the second node Q2 and is configured to receive the display reset signal STD and the fourth voltage VGL1. For example, during the display period of one frame, the seventh reset circuit 280 is turned on in response to the display reset signal STD, so that the fourth voltage VGL1 is used to pull down and reset the second node Q2.

For example, the eighth reset circuit 290 is connected to the second node Q2 and is configured to receive the global reset signal TRST and the fourth voltage VGL1. For example, in the case where the plurality of shift register units 21 are cascaded to form the gate driving circuit 20, before the display period of one frame, the eighth reset circuit 290 in each stage shift register unit 21 is turned on in response to the global reset signal TRST, so that the fourth voltage VGL1 is used to pull down and reset the second node Q2, thereby achieving the global reset of the gate driving circuit 20.

Although a plurality of control circuits and a plurality of reset circuits are shown in FIG. 11, the above examples cannot limit the protection scope of the present disclosure. In practical applications, one or more of the above circuits may be chosen to use or not use according to situations. Various combinations and modifications based on the foregoing circuits do not depart from the principle of present disclosure, details are omitted herein.

Figure 12A:
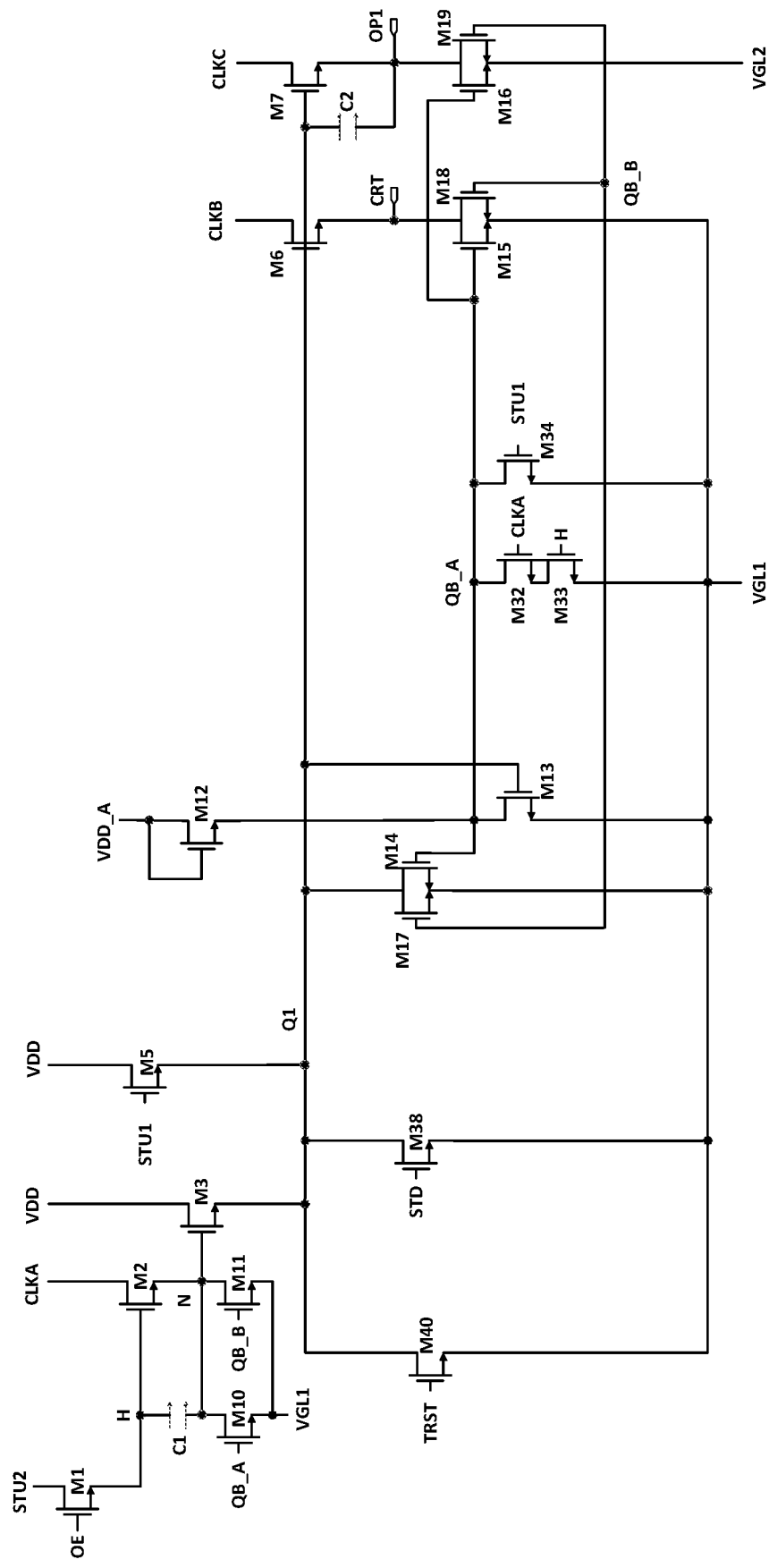
FIG. 12A and FIG. 12B are circuit diagrams of a shift register unit provided by at least one embodiment of the present disclosure.
Figure 12B:
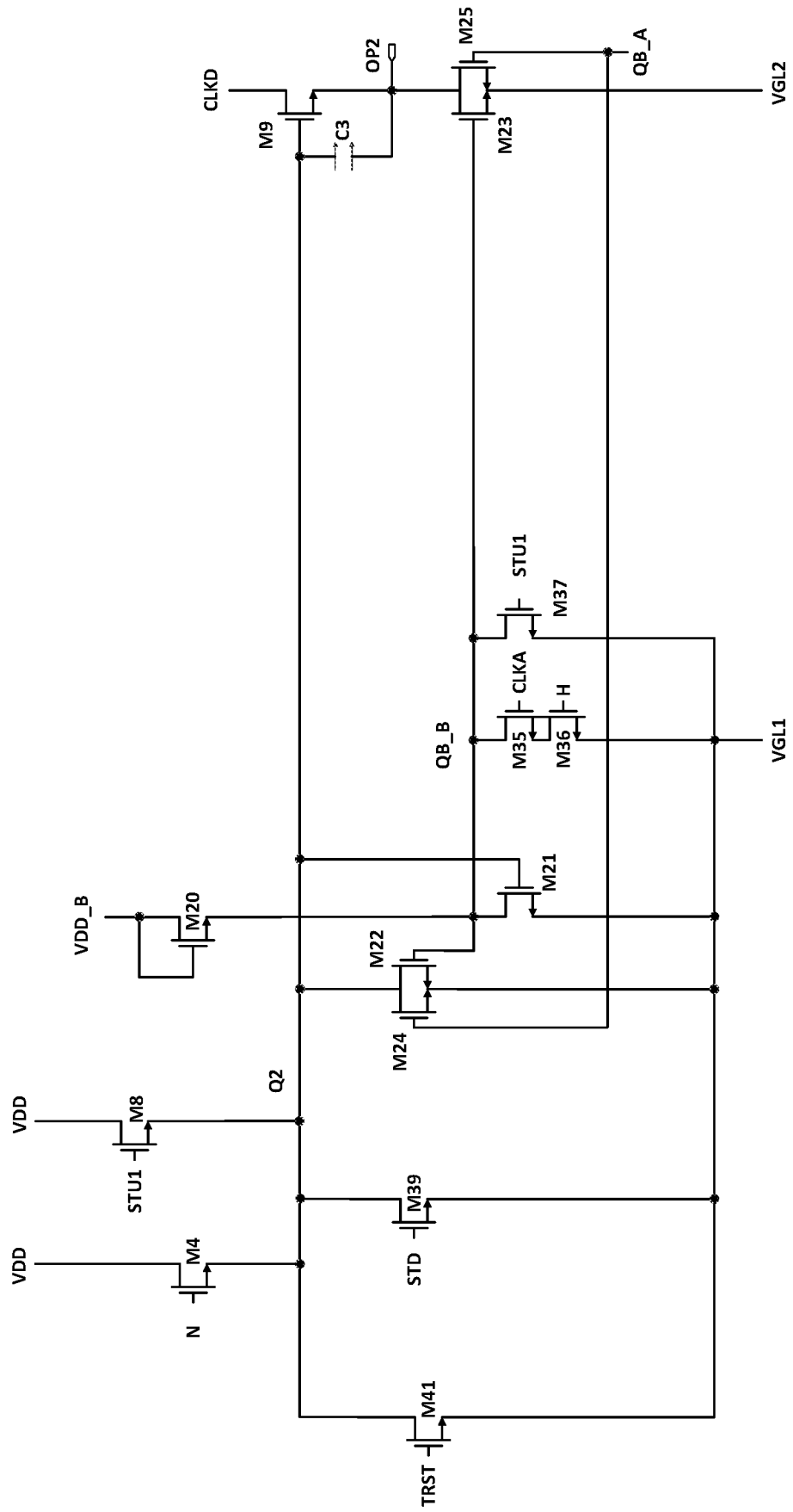

In at least one embodiment of the present disclosure, the shift register unit 21 shown in FIG. 11 is implemented as the circuit structure shown in FIGS. 12A and 12B. It should be noted that, for the sake of clarity, FIG. 12A shows a portion of the first sub-unit 100 and the blanking input sub-unit 300 of the shift register unit 21 except the second transmission circuit 330, FIG. 12B shows the second sub-unit 200 and the second transmission circuit 330 in the shift register unit 21, and the circuits in FIGS. 12A and 12B are electrically connected through corresponding nodes. The schematic manners of the circuit structure of the shift register unit 21 in the following embodiments are the same as those described here, and repeated description will be omitted.

As shown in FIGS. 12A and 12B, the shift register unit 21 includes: the first transistor M1 to a forty-first transistor M41, the first capacitor C1, a second capacitor C2, and a third capacitor C3. It should be noted that the transistors shown in FIGS. 12A and 12B are all described by taking N-type transistors as an example, and the parts of the blanking input sub-unit 300 described above will not be repeated here.

As shown in FIG. 12A, the first input circuit 110 is implemented as a fifth transistor M5. A gate electrode of the fifth transistor M5 is configured to receive the first input signal STU1, a first electrode of the fifth transistor M5 is configured to receive the first voltage VDD, and a second electrode of the fifth transistor M5 is connected to the first node Q1.

Figure 13A:
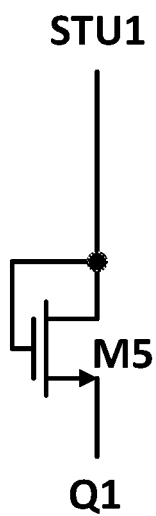
FIG. 13A to FIG. 13C are circuit diagrams of three first input circuits provided by the embodiments of the present disclosure.

For example, in at least another example, as shown in FIG. 13A, the gate electrode of the fifth transistor M5 is connected to the first electrode of the fifth transistor M5 and is configured to receive the first input signal STU1, so that in the case where the first input signal STU1 is a high level, the first input signal STU1 with a high level is used to charge the first node Q1.

Figure 13B:
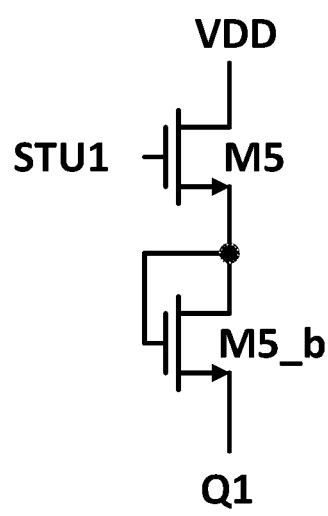

For example, in at least yet another example, as shown in FIG. 13B, the first input circuit 110 further includes a transistor M5_b. A gate electrode of the transistor M5_b and a first electrode of the transistor M5_b are connected to the second electrode of the fifth transistor M5, and a second electrode of the transistor M5_b is connected to the first node Q1. Because the transistor M5_b uses a diode connection manner, the current can only flow from the first electrode of the transistor M5_b to the second electrode of the transistor M5_b, and cannot flow from the second electrode of the transistor M5_b (that is, the first node Q1) to the first electrode of the transistor M5_b, thereby preventing the first node Q1 from leaking electricity through the fifth transistor M5.

Figure 13C:
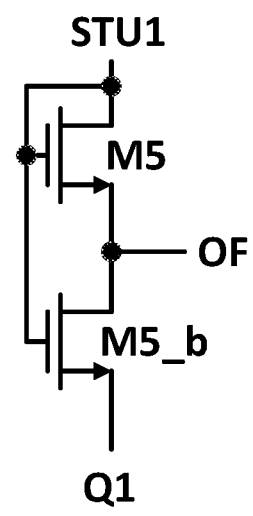

For example, in at least yet another example, as shown in FIG. 13C, the gate electrode of the transistor M5_b and the gate electrode of the fifth transistor M5 are connected, and are both configured to receive the first input signal STU1, and the first electrode of the transistor M5_b is connected to the seventh node OF. The first input circuit 110 shown in FIG. 13C adopts an electric-leakage prevention structure to prevent electric leakage of the first node Q1. It should be noted that the working principle of the electric-leakage prevention and the seventh node OF will be described below, and will not be repeated here.

As shown in FIG. 12A, the first output circuit 120 is implemented to include a sixth transistor M6, a seventh transistor M7, and the second capacitor C2. A gate electrode of the sixth transistor M6 is connected to the first node Q1. A first electrode of the sixth transistor M6 is configured to receive the second clock signal CLKB that is used as the shift signal CR. A second electrode of the sixth transistor M6 is connected to the shift signal output terminal CRT and is configured to output the shift signal CR.

A gate electrode of the seventh transistor M7 is connected to the first node Q1, a first electrode of the seventh transistor M7 is configured to receive the third clock signal CLKC that is used as the first output signal OUT1, and a second electrode of the seventh transistor M7 is connected to the first output signal terminal OP1 and configured to output the first output signal OUT1. A first electrode of the second capacitor C2 is connected to the first node Q1, and a second electrode of the second capacitor C2 is connected to the second electrode (that is, the first output signal terminal OP1) of the seventh transistor M7.

As shown in FIG. 12B, the second input circuit 210 is implemented as an eighth transistor M8. A gate electrode of the eighth transistor M8 is configured to receive the first input signal STU1, a first electrode of the eighth transistor M8 is configured to receive the first voltage VDD, and a second electrode of the eighth transistor M8 is connected to the second node Q2. It should be noted that the second input circuit 210 may also adopt a circuit structure similar to the circuit structure as shown in FIGS. 13A-13C, and details are not described herein again.

As shown in FIG. 12B, the second output circuit 220 is implemented to include a ninth transistor M9 and a third capacitor C3. A gate electrode of the ninth transistor M9 is connected to the second node Q2. A first electrode of the ninth transistor M9 is configured to receive the fourth clock signal CLKD that is used as the second output signal OUT2. A second electrode of the ninth transistor M9 is connected to the second output signal terminal OP2 and configured to output the second output signal OUT2. A first electrode of the third capacitor C3 is connected to the second node Q2, and a second electrode of the third capacitor C3 is connected to the second electrode (that is, the second output signal terminal OP2) of the ninth transistor M9.

As shown in FIG. 12A, the common reset circuit 340 is implemented to include a tenth transistor M10 and an eleventh transistor M11. A gate electrode of the tenth transistor M10 is connected to the fifth node QB_A, a first electrode of the tenth transistor M10 is connected to the fourth node N, and a second electrode of the tenth transistor M10 is configured to receive the fourth voltage VGL1. A gate electrode of the eleventh transistor M11 is connected to the sixth node QB_B, a first electrode of the eleventh transistor M11 is connected to the fourth node N, and a second electrode of the eleventh transistor M11 is configured to receive the fourth voltage VGL1.

As shown in FIG. 12A, the first control circuit 130 is implemented to include a twelfth transistor M12 and a thirteenth transistor M13. A gate electrode of the twelfth transistor M12 and a first electrode of the twelfth transistor M12 are configured to receive the second voltage VDD_A, and a second electrode of the twelfth transistor M12 is connected to the fifth node QB_A. A gate electrode of the thirteenth transistor M13 is connected to the first node Q1, a first electrode of the thirteenth transistor M13 is connected to the fifth node QB_A, and a second electrode of the thirteenth transistor M13 is configured to receive the fourth voltage VGL1.

As shown in FIG. 12A, the first reset circuit 140 is implemented to include a fourteenth transistor M14, a fifteenth transistor M15, and a sixteenth transistor M16, and the second reset circuit 150 is implemented to include a seventeenth transistor M17, an eighteenth transistor M18, and a nineteenth transistor M19.

A gate electrode of the fourteenth transistor M14 is connected to the fifth node QB_A, a first electrode of the fourteenth transistor M14 is connected to the first node Q1, and a second electrode of the fourteenth transistor M14 is configured to receive the fourth voltage VGL1. A gate electrode of the fifteenth transistor M15 is connected to the fifth node QB_A, a first electrode of the fifteenth transistor M15 is connected to the shift signal output terminal CRT, and a second electrode of the fifteenth transistor M15 is configured to receive the fourth voltage VGL1. A gate electrode of the sixteenth transistor M16 is connected to the fifth node QB_A, a first electrode of the sixteenth transistor M16 is connected to the first output signal terminal OP1, and a second electrode of the sixteenth transistor is configured to receive the fifth voltage VGL2.

A gate electrode of the seventeenth transistor M17 is connected to the sixth node QB_B, a first electrode of the seventeenth transistor M17 is connected to the first node Q1, and a second electrode of the seventeenth transistor M17 is configured to receive the fourth voltage VGL1. A gate electrode of the eighteenth transistor M18 is connected to the sixth node QB_B, a first electrode of the eighteenth transistor M18 is connected to the shift signal output terminal CRT, and a second electrode of the eighteenth transistor M18 is configured to receive the fourth voltage VGL1. A gate electrode of the nineteenth transistor M19 is connected to the sixth node QB_B, a first electrode of the nineteenth transistor M19 is connected to the first output signal terminal OP1, and a second electrode of the nineteenth transistor M19 is configured to receive the fifth voltage VGL2.

As shown in FIG. 12B, the second control circuit 230 is implemented to include a twentieth transistor M20 and a twenty-first transistor M21. A gate electrode of the twentieth transistor M20 and a first electrode of the twentieth transistor M20 are configured to receive the third voltage VDD_B, and a second electrode of the twentieth transistor M20 is connected to the sixth node QB_B. A gate electrode of the twenty-first transistor M21 is connected to the second node Q2, a first electrode of the twenty-first transistor M21 is connected to the sixth node QB_B, and a second electrode of the twenty-first transistor M21 is configured to receive the fourth voltage VGL1.

As shown in FIG. 12B, the third reset circuit 240 is implemented to include a twenty-second transistor M22 and a twenty-third transistor M23, and the fourth reset circuit 250 is implemented to include a twenty-fourth transistor M24 and a twenty-fifth transistor M25.

A gate electrode of the twenty-second transistor M22 is connected to the sixth node QB_B, a first electrode of the twenty-second transistor M22 is connected to the second node Q2, and a second electrode of the twenty-second transistor M22 is configured to receive the fourth voltage VGL1. A gate electrode of the twenty-third transistor M23 is connected to the sixth node QB_B, a first electrode of the twenty-third transistor M23 is connected to the second output signal terminal OP2, and a second electrode of the twenty-third transistor M23 is configured to receive the fifth voltage VGL2.

A gate electrode of the twenty-fourth transistor M24 is connected to the fifth node QB_A, a first electrode of the twenty-fourth transistor M24 is connected to the second node Q2, and a second electrode of the twenty-fourth transistor M24 is configured to receive the fourth voltage VGL1. A gate electrode of the twenty-fifth transistor M25 is connected to the fifth node QB_A, a first electrode of the twenty-fifth transistor M25 is connected to the second output signal terminal OP2, and a second electrode of the twenty-fifth transistor M25 is configured to receive the fifth voltage VGL2.

It should be noted that, in the embodiments of the present disclosure, for example, the second voltage VDD_A and the third voltage VDD_B are configured to be mutually inverted signals, that is, in the case where the second voltage VDD_A is at a high level, the third voltage VDD_B is at a low level, and in the case where the second voltage VDD_A is at a low level, the third voltage VDD_B is at a high level. In this way, only one of the twelfth transistor M12 and the twentieth transistor M20 is turned on at the same time, so that the performance drift caused by the long-term conduction of the transistors is avoided, and the stability of the circuit is improved.

In the shift register unit 21 shown in FIGS. 12A and 12B, the first control circuit 130 is provided in the first sub-unit 100 and is used to control the level of the fifth node QB_A, and the second control circuit 230 is provided in the second sub-unit 200 and is used to control the level of the sixth node QB_B. In this way, the number of transistors is reduced, so that the area occupied by the gate driving circuit 20 using the shift register unit 21 is further reduced, and furthermore, the frame size of the display device using the gate driving circuit 20 can be reduced, and the PPI of the display device can be increased.

As shown in FIG. 12A, the third control circuit 160 is implemented to include a thirty-second transistor M32 and a thirty-third transistor M33. A gate electrode of the thirty-second transistor M32 is configured to receive the first clock signal CLKA, a first electrode of the thirty-second transistor M32 is connected to the fifth node QB_A, and a second electrode of the thirty-second transistor M32 is connected to a first electrode of the thirty-third transistor M33. A gate electrode of the thirty-third transistor M33 is connected to the third node H, and a second electrode of the thirty-third transistor M33 is configured to receive the fourth voltage VGL1.

The fourth control circuit 170 is implemented as a thirty-fourth transistor M34. A gate electrode of the thirty-fourth transistor M34 is configured to receive the first input signal STU1, a first electrode of the thirty-fourth transistor M34 is connected to the fifth node QB_A, and a second electrode of the thirty-fourth transistor M34 is configured to receive the fourth voltage VGL1.

As shown in FIG. 12B, the fifth control circuit 260 is implemented to include a thirty-fifth transistor M35 and a thirty-sixth transistor M36. A gate electrode of the thirty-fifth transistor M35 is configured to receive the first clock signal CLKA, a first electrode of the thirty-fifth transistor M35 is connected to the sixth node QB_B, and a second electrode of the thirty-fifth transistor M35 is connected to a first electrode of the thirty-sixth transistor M36. A gate electrode of the thirty-sixth transistor M36 is connected to the third node H, and a second electrode of the thirty-sixth transistor M36 is configured to receive the fourth voltage VGL1.

The sixth control circuit 270 is implemented as a thirty-seventh transistor M37. A gate electrode of the thirty-seventh transistor M37 is configured to receive the first input signal STU1, a first electrode of the thirty-seventh transistor M37 is connected to the sixth node QB_B, and a second electrode of the thirty-seventh transistor M37 is configured to receive the fourth voltage VGL1.

As shown in FIG. 12A, the fifth reset circuit 180 is implemented as a thirty-eighth transistor M38, and the sixth reset circuit 190 is implemented as a fortieth transistor M40. A gate electrode of the thirty-eighth transistor M38 is configured to receive the display reset signal STD, a first electrode of the thirty-eighth transistor M38 is connected to the first node Q1, and a second electrode of the thirty-eighth transistor M38 is configured to receive the fourth voltage VGL1. A gate electrode of the fortieth transistor M40 is configured to receive the global reset signal TRST, a first electrode of the fortieth transistor M40 is connected to the first node Q1, and a second electrode of the fortieth transistor M40 is configured to receive the fourth voltage VGL1.

As shown in FIG. 12B, the seventh reset circuit 280 is implemented as a thirty-ninth transistor M39, and the eighth reset circuit 290 is implemented as the forty-first transistor M41. A gate electrode of the thirty-ninth transistor M39 is configured to receive the display reset signal STD, a first electrode of the thirty-ninth transistor M39 is connected to the second node Q2, and a second electrode of the thirty-ninth transistor M39 is configured to receive the fourth voltage VGL1. A gate electrode of the forty-first transistor M41 is configured to receive the global reset signal TRST, a first electrode of the forty-first transistor M41 is connected to the second node Q2, and a second electrode of the forty-first transistor M41 is configured to receive the fourth voltage VGL1.

It should be noted that, in the electronic panel 10 provided in the embodiments of the present disclosure, in the case where the plurality of shift register units 21 are cascaded to form the gate driving circuit 20, the first output signal terminal OP1 in the first stage shift register unit is the first output terminal OT<1> of the gate driving circuit 20, and the second output signal terminal OP2 in the first stage shift register unit is the second output terminal OT<2> of the gate driving circuit 20. The corresponding relationship between the other shift register units 21 and the output terminals of the gate driving circuit 20 is similar to those described above, and will not be described again.

As mentioned above, in the shift register unit 21 provided by the embodiments of the present disclosure, for example, the electric potential at the third node H can be maintained by the first capacitor C1, the electric potential at the first node Q1 can be maintained by the second capacitor C2, and the electric potential at the second node Q2 is maintained by the third capacitor C3. The first capacitor C1, the second capacitor C2, and the third capacitor C3 may be capacitor devices manufactured through a process. For example, the capacitor device is achieved by manufacturing special capacitor electrodes, and each electrode of the capacitor is implemented by a metal layer or a semiconductor layer (such as doped polysilicon) or the like; or in some examples, by designing circuit wiring parameters, the first capacitor C1, the second capacitor C2, and the third capacitor C3 can also be implemented by the parasitic capacitors among various devices. The connection method of the first capacitor C1, the second capacitor C2, and the third capacitor C3 is not limited to the above-mentioned method, or may be other suitable connection methods, as long as the levels written to the third node H, the first node Q1, and the second node Q2 are stored.

In the case where the electric potential of the first node Q1, the second node Q2, or the third node H is maintained at a high level, the first electrodes of some transistors (for example, the first transistor M1, the fourteenth transistor M14, the seventeenth transistor M17, the thirty-eighth transistor M38, the fortieth transistor M40, the twenty-second transistor M22, the twenty-fourth transistor M24, the thirty-ninth transistor M39, and the forty-first transistor M41, and so on) are connected to the first node Q1, the second node Q2, or the third node H, and the second electrodes of these transistors are connected to a low level signal. Even in the case where a non-conducting signal is input to the gate electrodes of these transistors, electric leakage may occur due to the voltage differences between the first electrodes and the second electrodes of the transistors, as a result, the effect of maintaining the electric potential of the first node Q1, the second node Q2, or the third node H is deteriorated.

For example, as shown in FIG. 12A, taking the third node H as an example, the first electrode of the first transistor M1 is configured to receive the second input signal STU2, and the second electrode of the first transistor M1 is connected to the third node H. In the case where the third node H is at a high level and the second input signal STU2 is at a low level, the third node H may leak electricity through the first transistor M1.

Figure 14A:
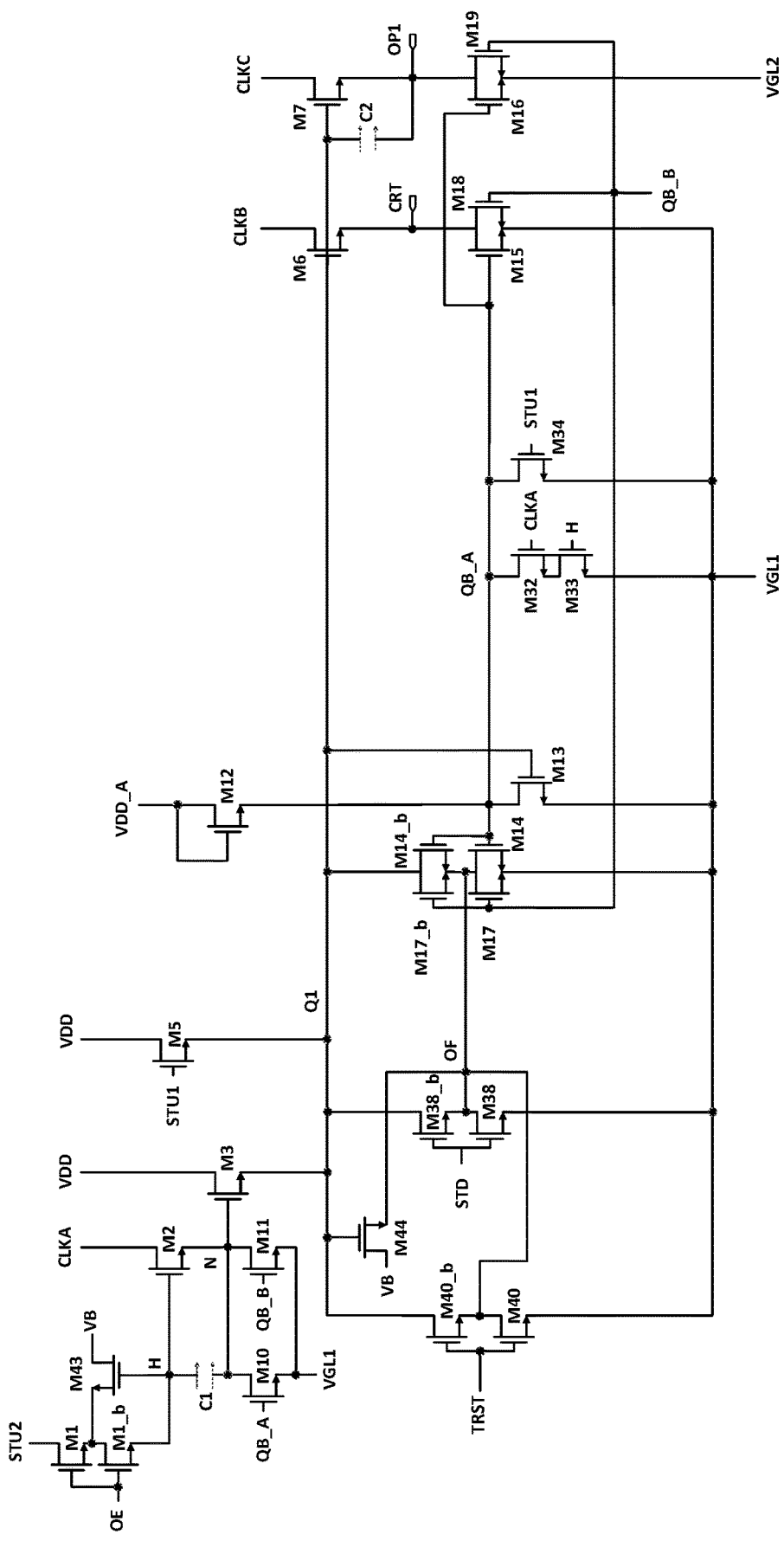
FIG. 14A to FIG. 14C are circuit diagrams of another shift register unit provided by at least one embodiment of the present disclosure.
Figure 14B:
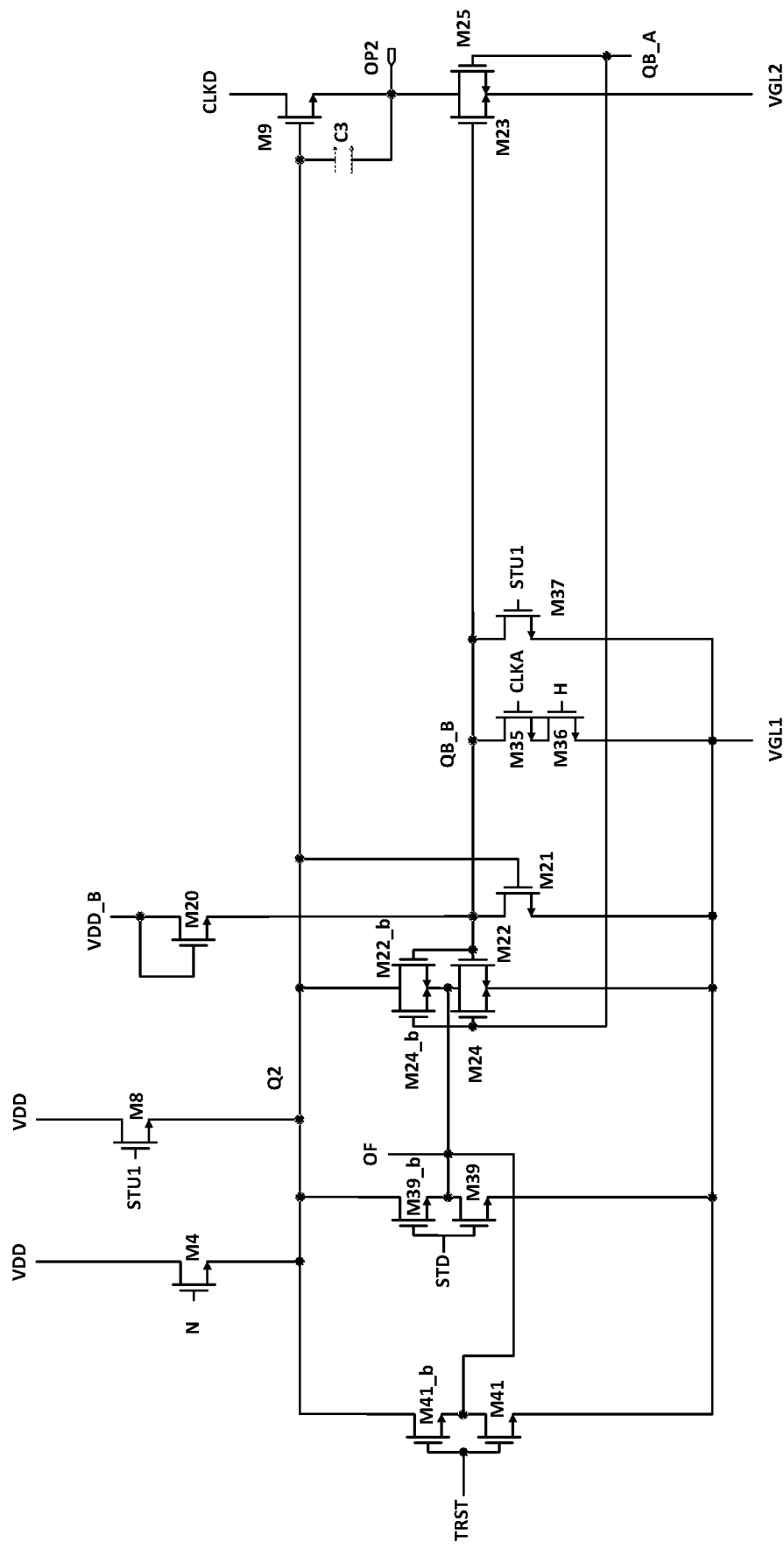

To prevent the electric leakage, for example, as shown in FIGS. 14A and 14B, at least one embodiment of the present disclosure provides the shift register unit 21 having an electric-leakage prevention structure. The shift register unit 21 further includes a common electric-leakage prevention circuit, a first electric-leakage prevention circuit, and a second electric-leakage prevention circuit.

The common electric-leakage prevention circuit is electrically connected to the first node Q1 and the seventh node OF, and is configured to control the level of the seventh node OF under the control of the level of the first node Q1. The first electric-leakage prevention circuit is electrically connected to the seventh node OF, the first reset circuit 140, the second reset circuit 150, the fifth reset circuit 180, and the sixth reset circuit 190, and is configured to prevent the electric leakage of the first node Q1 under the control of the level of the seventh node OF. The second electric-leakage prevention circuit is electrically connected to the seventh node OF, the third reset circuit 240, the fourth reset circuit 250, the seventh reset circuit 280, and the eighth reset circuit 290, and is configured to prevent the electric leakage of the second node Q2 under the control of the level of the seventh node OF.

For example, as shown in FIGS. 14A and 14B, the common electric-leakage prevention circuit is implemented as a forty-fourth transistor M44, a gate electrode of the forty-fourth transistor M44 is connected to the first node Q1, a first electrode of the forty-fourth transistor M44 is configured to receive the sixth voltage VB, and a second electrode of the forty-fourth transistor M44 is connected to the seventh node OF. The first electric-leakage prevention circuit is implemented to include transistors M14_b, M17_b, M38_b, and M40_b. The second electric-leakage prevention circuit is implemented to include transistors M22_b, M24_b, M39_b, and M41_b. The connection relationship of the transistors M14_b, M17_b, M38_b, M40_b, M22_b, M24_b, M39_b, and M41_b is shown in FIGS. 14A and 14B, and is not repeated here.

At the same time, as shown in FIG. 14A, in order to prevent the electric leakage at the third node H, a forty-third transistor M43 and a transistor M1_b are also added. In the following, the working principle of electric-leakage prevention will be described by taking the transistor M1_b as an example.

A gate electrode of the transistor M1_b is connected to the gate electrode of the first transistor M1, a first electrode of the transistor M1_b is connected to a second electrode of the forty-third transistor M43, and a second electrode of the transistor M1_b is connected to the third node H. A gate electrode of the forty-third transistor M43 is connected to the third node H, and a first electrode of the forty-third transistor M43 is configured to receive the sixth voltage VB (for example, a high level). In the case where the third node H is at a high level, the forty-third transistor M43 is turned on under the control of the level of the third node H, so that the sixth voltage VB with a high level is input to the first electrode of the transistor M1_b, thus both the first electrode and the second electrode of the transistor M1_b are at a high level, and the charges at the third node H are prevented from leaking through the transistor M1_b. At this time, because the gate electrode of the transistor M1_b is connected to the gate electrode of the first transistor M1, the combination of the first transistor M1 and the transistor M1_b achieves the same function as the aforementioned first transistor M1, and also has the effect of preventing electric leakage.

Similarly, as shown in FIG. 14A, the transistors M14_b, M17_b, M38_b, and M40_b are, for example, connected to the forty-fourth transistor M44 through the seventh node OF, to respectively implement electric-leakage prevention structures, so that the electric leakage of the first node Q1 is prevented. As shown in FIG. 14B, the transistors M22_b, M24_b, M39_b, and M41_b are, for example, connected to the forty-fourth transistor M44 through the seventh node OF to implement electric-leakage prevention structures, respectively, so that the electric leakage of the second node Q2 is prevented.

In the shift register unit 21 shown in FIGS. 14A and 14B, the first electric-leakage prevention circuit and the second electric-leakage prevention circuit share the transistor M44, so that the number of transistors is reduced, so as to reduce the area occupied by the gate driving circuit 20 using the shift register unit 21, thereby further reducing the frame size of the display device using the gate driving circuit 20 and increasing the PPI of the display device.

Figure 14C:
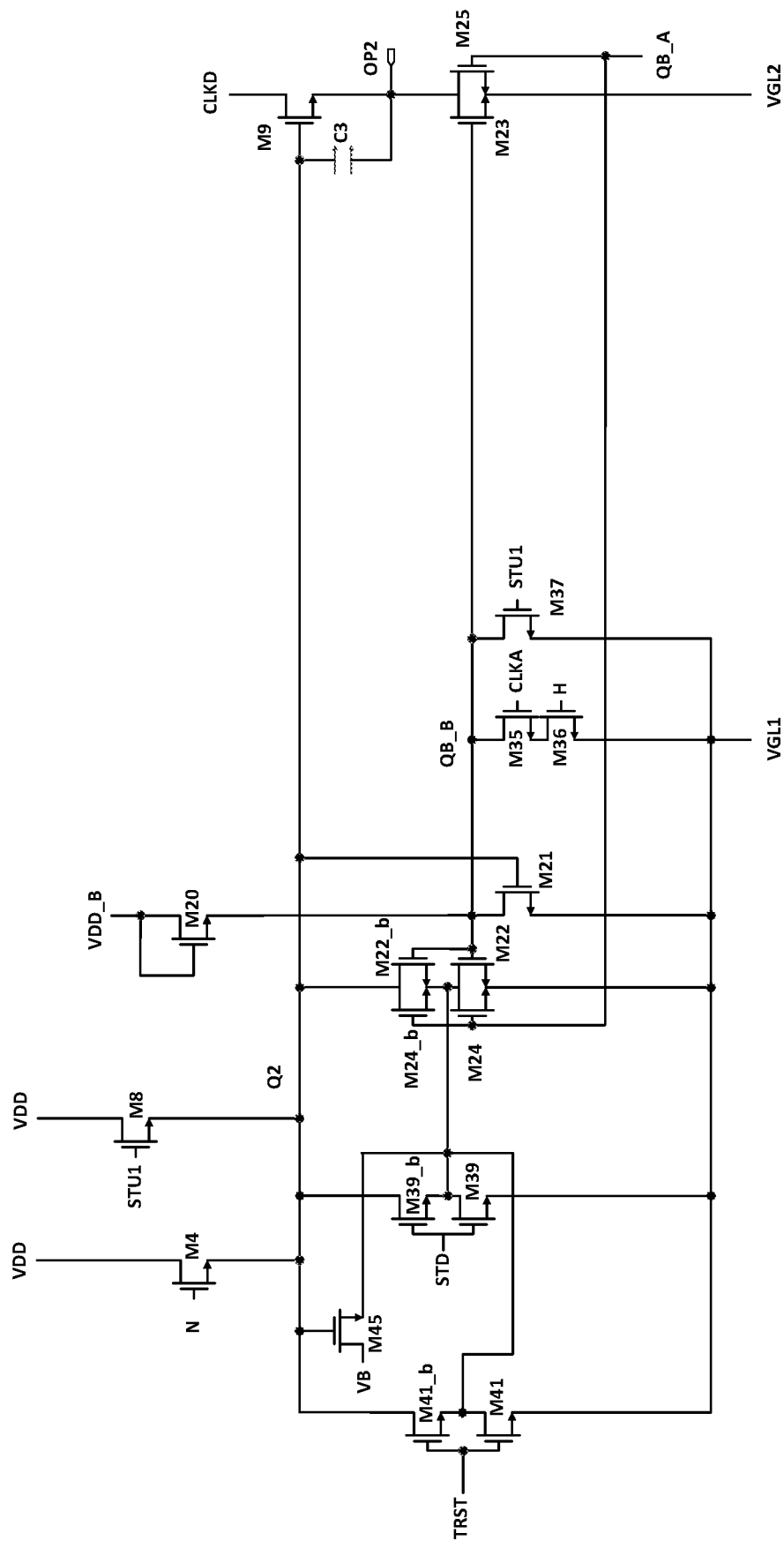

For example, in at least another example, as shown in FIG. 14C, the second electric-leakage prevention circuit (the transistors M22_b, M24_b, M39_b, and M41_b) may not be connected to the seventh node OF, instead, a forty-fifth transistor M45 is separately provided to form the electric-leakage prevention structure, the detail descriptions will not be repeated here.

Similarly, as shown in FIG. 10, for the third transistor M3 and the fourth transistor M4, a transistor M3_b and a transistor M4_b are, for example, respectively provided to achieve the electric-leakage prevention structure. A gate electrode of the transistor M3_b and a gate electrode of the transistor M4_b are both configured to receive the first clock signal CLKA, and a first electrode of the transistor M3_b and a first electrode of the transistor M4_b are both connected to the seventh node OF, thereby achieving that the the transistor M3_b and the transistor M4_b are connected with the forty-fourth transistor M44 in FIG. 14A, to respectively achieve the electric-leakage prevention structures, so that the electric leakage of the first node Q1 and the electric leakage of the second node Q2 are prevented.

Similarly, as shown in FIG. 13C, for the fifth transistor M5, a transistor M5_b is, for example, provided to implement the electric-leakage prevention structure. A gate electrode of the transistor M5_b is configured to receive the first input signal STU1, and a first electrode of the transistor M5_b is connected to the seventh node OF, so as to be connected to the forty-fourth transistor M44 in FIG. 14A to implement the electric-leakage prevention structure, and thereby preventing the electric leakage of the first node Q1.

The transistors used in the embodiments of the present disclosure may all be thin film transistors or field effect transistors or other switching devices with the same characteristics. In the embodiments of the present disclosure, the thin film transistors are taken as examples for description. A source electrode and a drain electrode of the transistor used here are, for example, symmetrical in structure, so there is no difference in structure between the source electrode and the drain electrode of the transistor. In the embodiments of the present disclosure, in order to distinguish the two electrodes of the transistor other than the gate electrode, one of the two electrodes is directly described as the first electrode and the other of the two electrodes is described as the second electrode. In addition, transistors are classified into N-type and P-type transistors according to the characteristics of the transistors. In the case where the transistor is the P-type transistor, a turn-on voltage of the transistor is a low level voltage (for example, 0V, −5V, −10V, or other suitable voltages), and a turn-off voltage of the transistor is a high level voltage (for example, 5V, 10V, or other suitable voltages); in the case where the transistor is the N-type transistor, the turn-on voltage is a high level voltage (for example, 5V, 10V or other suitable voltages), and the turn-off voltage is a low level voltage (for example, 0V, −5V, −10V or other suitable voltages).

Figure 15:
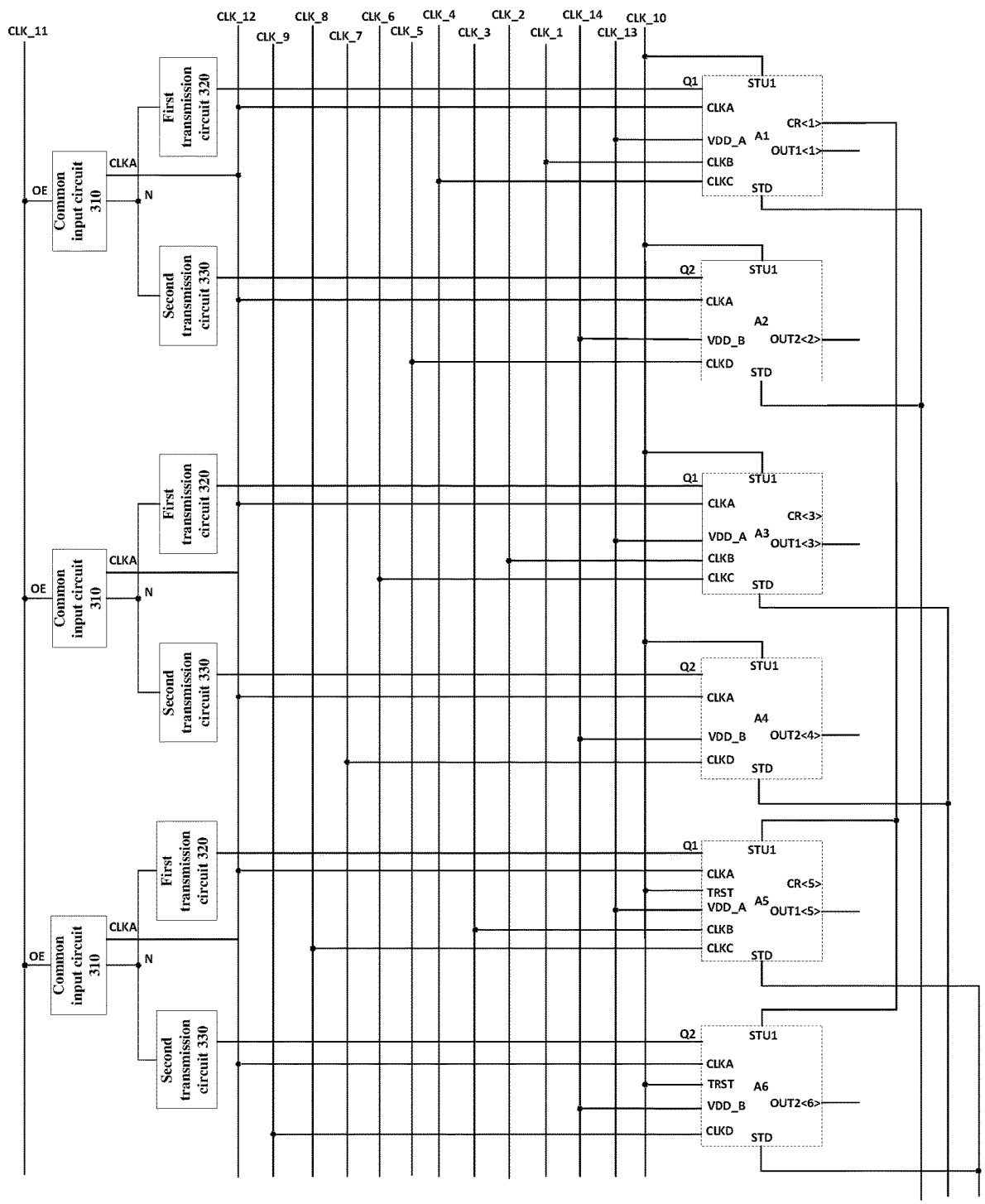
FIG. 15 is a schematic diagram of a gate driving circuit provided by at least one embodiment of the present disclosure.

At least one embodiment of the present disclosure further provides the gate driving circuit 20, as shown in FIG. 15, the gate driving circuit 20 includes the plurality of cascaded shift register units 21, and any one or more shift register units 21 may adopt the structure of the shift register unit 21 provided by the embodiments of the present disclosure or a modification thereof. A1, A2, A3, A4, A5, and A6 in FIG. 15 represent sub-units in the shift register unit 21, for example, A1, A3, and A5 represent the first sub-units of three shift register units 21, respectively, and A2, A4, and A6 represent the second sub-units of the three shift register units 21, respectively.

For example, as shown in FIG. 15, each shift register unit 21 includes the first sub-unit and the second sub-unit to output the first output signal OUT1 and the second output signal OUT2, respectively. In the case where the gate driving circuit 20 is used to drive the plurality of rows of sub-pixel units in the electronic panel 10, each of the first output signal OUT1 and the second output signal OUT2 drives one row of sub-pixel units in the electronic panel 10. For example, A1, A2, A3, A4, A5, and A6 drive the first row of sub-pixel units, the second row of sub-pixel units, the third row of sub-pixel units, the fourth row of sub-pixel units, the fifth row of sub-pixel units, and sixth row of sub-pixel units of the electronic panel 10, respectively.

The gate driving circuit 20 provided in the embodiments of the present disclosure share the blanking input sub-unit, thereby reducing the frame size of the display device using the gate driving circuit 20 and increasing the PPI of the display device. At the same time, random compensation is also achieved, so that display defects, such as the scanning line and uneven display brightness that are caused by progressive compensation, are avoided.

In the following, taking the gate driving circuit 20 shown in FIG. 15 as an example, the signal lines in the gate driving circuit 20 are described.

As shown in FIG. 15, the gate driving circuit 20 includes a first sub-clock signal line CLK_1, a second sub-clock signal line CLK_2, and a third sub-clock signal line CLK_3. The first sub-unit in a (3k−2)-th stage shift register unit is connected to the first sub-clock signal line CLK_1 to receive the second clock signal CLKB of the (3k−2)-th stage shift register unit; the first sub-unit in a (3k−1)-th stage shift register unit is connected to the second sub-clock signal line CLK_2 to receive the second clock signal CLKB of the (3k−1)-th stage shift register unit; the first sub-unit in a 3k-th stage shift register unit is connected to the third sub-clock signal line CLK_3 to receive the second clock signal CLKB of the 3k-th stage shift register unit; k is an integer greater than zero.

As mentioned above, in the case where the shift register units 21 are cascaded, it is only necessary to sequentially provide the second clock signal CLKB to the first sub-unit in each stage shift register unit 21, and the second clock signal CLKB is, for example, used as the shift signal CR and is output to complete scanning and shift.

As shown in FIG. 15, the gate driving circuit 20 further includes a fourth sub-clock signal line CLK_4, a fifth sub-clock signal line CLK_5, a sixth sub-clock signal line CLK_6, a seventh sub-clock signal line CLK_7, an eighth sub-clock signal line CLK_8, a ninth sub-clock signal line CLK_9, a fifteenth sub-clock signal line CLK_15, a sixteenth sub-clock signal line CLK_16, a seventeenth sub-clock signal line CLK_17, and an eighteenth sub-clock signal line CLK_18. It should be noted that, for clarity, the fifteenth sub-clock signal line CLK_15, the sixteenth sub-clock signal line CLK_16, the seventeenth sub-clock signal line CLK_17, and the eighteenth sub-clock signal line CLK_18 are not shown in FIG. 15.

The first sub-unit in the (3k−2)-th stage shift register unit is connected to the fourth sub-clock signal line CLK_4 to receive the third clock signal CLKC of the (3k−2)-th stage shift register unit, and the second sub-unit in the (3k−2)-th stage shift register unit is connected to the fifth sub-clock signal line CLK_5 to receive the fourth clock signal CLKD of the (3k−2)-th stage shift register unit.

The first sub-unit in the (3k−1)-th stage shift register unit is connected to the sixth sub-clock signal line CLK_6 to receive the third clock signal CLKC of the (3k−1)-th stage shift register unit, and the second sub-unit in the (3k−1)-th stage shift register unit is connected to the seventh sub-clock signal line CLK_7 to receive the fourth clock signal CLKD of the (3k−1)-th stage shift register unit.

The first sub-unit in the 3k-th stage shift register unit is connected to the eighth sub-clock signal line CLK_8 to receive the third clock signal CLKC of the 3k-th stage shift register unit, and the second sub-unit in the 3k-th stage shift register unit is connected to the ninth sub-clock signal line CLK_9 to receive the fourth clock signal CLKD of the 3k-th stage shift register unit.

As described above, the driving signals that are output row by row (for specific signal time sequence, refer to FIG. 16) are provided to the shift register units 21 by a total of ten clock signal lines including the fourth sub-clock signal line CLK_4, the fifth sub-clock signal line CLK_5, the sixth sub-clock signal line CLK_6, the seventh sub-clock signal line CLK_7, the eighth sub-clock signal line CLK_8, the ninth sub-clock signal line CLK_9, the fifteenth sub-clock signal line CLK_15, the sixteenth sub-clock signal line CLK_16, the seventeenth sub-clock signal line CLK_17, and the eighteenth sub-clock signal line CLK_18. That is, the gate driving circuit 20 provided in the embodiments of the present disclosure uses 10CLK clock signals, so that the waveforms of the driving signals output by the gate driving circuit 20 can overlap, and for example, the pre-charging time of each row of sub-pixel units is increased. Therefore, the gate driving circuit 20 can be applied to high-frequency scanning display.

As shown in FIG. 15, the gate driving circuit 20 further includes a tenth sub-clock signal line CLK_10, an eleventh sub-clock signal line CLK_11, and a twelfth sub-clock signal line CLK_12.

As shown in FIG. 15, in this embodiment, the tenth sub-clock signal line CLK_10 is connected to the first sub-units and the second sub-units (i.e., A1, A2, A3, and A4) in the first two stages of the shift register units 21 to provide the first input signal STU1, and at the same time, the tenth sub-clock signal line CLK_10 is also connected to other stage shift register units 21 to provide the global reset signal TRST. In this way, the number of clock signal lines is reduced, thereby reducing the frame size of the display device using the gate driving circuit 20 and increasing the PPI of the display device. For example, for the first two stages of the shift register units 21, the fortieth transistor M40 and the forty-first transistor M41 may not be provided.

The common input circuit 310 in each stage shift register unit 21 is connected to the eleventh sub-clock signal line CLK_11 to receive the selection control signal OE. The first sub-unit, the second sub-unit, and the common input circuit 310 in each stage shift register unit 21 are all connected to the twelfth sub-clock signal line CLK_12 to receive the first clock signal CLKA.

As shown in FIG. 15, the gate driving circuit 20 further includes a thirteenth sub-clock signal line CLK_13 and a fourteenth sub-clock signal line CLK_14.

For example, the first sub-unit in each stage shift register unit 21 is connected to the thirteenth sub-clock signal line CLK_13 to receive the second voltage VDD_A; the second sub-unit in each stage shift register unit 21 is connected to the fourteenth sub-clock signal line CLK_14 to receive the third voltage VDD_B.

As shown in FIG. 15, except for the first two stages of the shift register units 21, both the first sub-units and the second sub-units in the other stages of the shift register units 21 are connected to the first sub-units in the first two stages of the shift register units 21 to receive the shift signal CR as the first input signal STU1. Except for the last four stages of shift register units 21, both the first sub-units and the second sub-units in the other stages of shift register units 21 are connected to the first sub-units in the last four stages of shift register units 21 to receive the shift signal CR as the display reset signal STD.

It should be noted that the cascading relationship shown in FIG. 15 is only an example. According to the description of the present disclosure, other cascading manners may also be adopted according to the actual situation.

Figure 16:
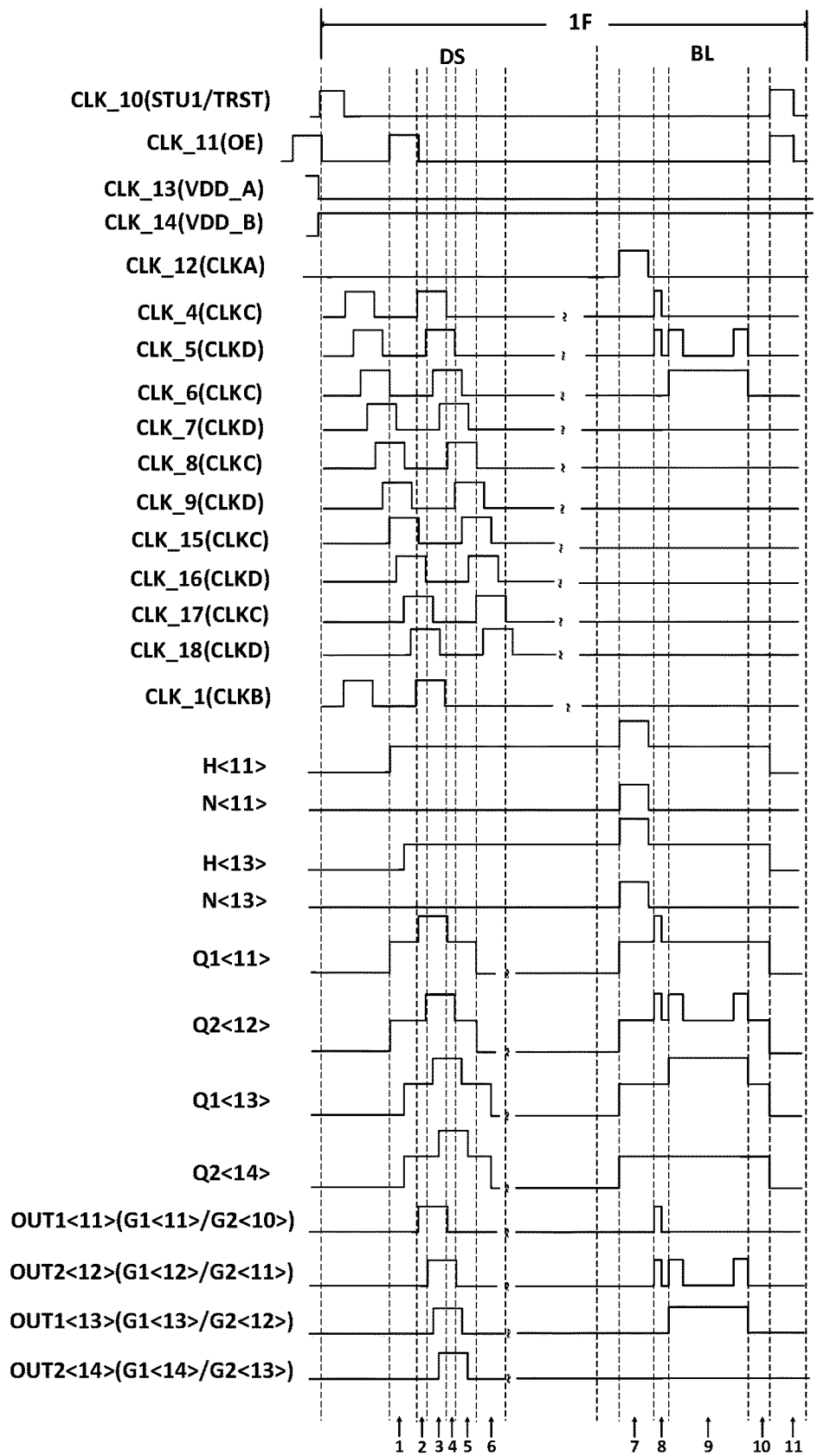
FIG. 16 is a signal timing diagram corresponding to the gate driving circuit shown in FIG. 15 during operation provided by at least one embodiment of the present disclosure.

For example, in at least one example, the shift register unit 21 in the gate driving circuit 20 shown in FIG. 15 adopts the circuit structure shown in FIGS. 12A and 12B, and FIG. 16 is a diagram of the signal timing when the gate driving circuit 20 shown in FIG. 15 is in operation.

In FIG. 16, H<11> and H<13> respectively represent the third node H in the sixth stage shift register unit 21 and the third node H in the seventh stage shift register unit 21, the sixth stage shift register unit 21 corresponds to the eleventh row and twelfth row of sub-pixel units in the electronic panel, and the seventh stage shift register unit 21 corresponds to the thirteenth row and fourteenth row of sub-pixel units in the electronic panel. N<11> and N<13> represent the fourth node N in the sixth stage shift register unit 21 and the fourth node N in the seventh stage shift register unit 21, respectively.

Q1<11> and Q2<12> respectively represent the first node Q1 and the second node Q2 that are in the sixth stage shift register unit 21; Q1<13> and Q2<14> respectively represent the first node Q1 and the second node Q2 that are in the seventh stage shift register unit 21. The number in parentheses indicates the number of rows of sub-pixel units in the electronic panel corresponding to the node. The following embodiments are the same, and similar portions will not be described again.

OUT1<11> and OUT2<12> represent the first output signal OUT1 and the second output signal OUT2, which are output by the sixth stage shift register unit 21, respectively. Similarly, OUT1<13> and OUT2<14> represent the first output signal OUT1 and the second output signal OUT2, which are output by the seventh stage shift register unit 21, respectively.

1F represents the first frame, DS represents the display period in the first frame, and BL represents the blanking period in the first frame. In addition, it should be noted that in FIG. 16, the second voltage VDD_A is at a low level and the third voltage VDD_B is at a high level for illustration, but the embodiments of the present disclosure are not limited thereto. The signal levels in the signal timing diagram shown in FIG. 16 are only schematic and do not represent true level values.

The working principle of the gate driving circuit 20 shown in FIG. 15 will be described below with reference to the signal timing diagram in FIG. 16 and the shift register unit 21 shown in FIGS. 12A and 12B.

Before the start of the first frame 1F, the tenth sub-clock signal line CLK_10 and the eleventh sub-clock signal line CLK_11 provide high levels, and the fortieth transistor M40 and the forty-first transistor M41 in each stage shift register unit 21 are turned on, so that the first node Q1 and the second node Q2 in each stage shift register unit 21 are reset; the first transistor M1 in each stage shift register unit 21 is turned on, because the second input signal STU2 that is received at the same time is a low level, the third node H in each stage shift register unit 21 is reset, thereby achieving a global reset before the start of the first frame 1F.

During the display period DS of the first frame 1F, the working process of the sixth stage shift register units 21 and the seventh stage shift register unit 21 (that is, corresponding to the eleventh to fourteenth rows of sub-pixel units in the electronic panel) is described as follows.

In the first stage 1, the shift signal (the signal provided by the fifteenth sub-clock signal line CLK_15) output by the first sub-unit in the fourth stage shift register unit 21 is at a high level, that is, the first input signal STU1 received by the sixth stage shift register unit 21 is a high level, so the fifth transistor M5 and the eighth transistor M8 are turned on. The first voltage VDD with a high level charges the first node Q1<11> through the fifth transistor M5, and charges the second node Q2<12> through the eighth transistor M8, thereby pulling up the first node Q1<11> and the second node Q2<12> to a high level.

The seventh transistor M7 is turned on under the control of the first node Q1<11>, however, because the third clock signal CLKC provided by the fourth sub-clock signal line CLK_4 is at a low level at this time, the first output signal OUT1<11> output by the six stage shift register unit 21 is at a low level; the ninth transistor M9 is turned on under the control of the second node Q2<12>, but because the fourth clock signal CLKD provided by the five sub-clock signal line CLK_5 is a low level at the same time, the second output signal OUT2<12> output by the sixth stage shift register unit 21 is a low level; at this stage, the pre-charging for the first node and the second node in the sixth stage shift register unit 21 are completed at the same time.

In the second stage 2, the third clock signal CLKC provided by the fourth sub-clock signal line CLK_4 becomes a high level, the electric potential of the first node Q1<11> is further pulled up due to the bootstrap effect, so the seventh transistor M7 remains on, so that the first output signal OUT1<11> output by the sixth stage shift register unit 21 becomes a high level. However, at this time, because the fourth clock signal CLKD provided by the fifth sub-clock signal line CLK_5 is still a low level, the second output signal OUT2<12> output by the sixth stage shift register unit 21 continues to maintain a low level.

In the third stage 3, the fourth clock signal CLKD provided by the fifth sub-clock signal line CLK_5 becomes a high level, the electric potential of the second node Q2<12> is further pulled up due to the bootstrap effect, and the ninth transistor M9 remains on, so that the second output signal OUT2<12> output by the sixth stage shift register unit 21 become a high level.

In the fourth stage 4, due to the holding effect of the second capacitor C2, the first node Q1<11> still remains at a high level, so the seventh transistor M7 is turned on. However, because the third clock signal CLKC provided by the fourth sub-clock signal line CLK_4 becomes a low level, the first output signal OUT1<11> output by the sixth stage shift register unit 21 becomes a low level. At the same time, due to the bootstrap effect of the second capacitor C2, the electric potential of the first node Q1<11> also drops.

In the fifth stage 5, due to the holding effect of the third capacitor C3, the second node Q2<12> still maintains a high level, so the ninth transistor M9 is turned on. However, because the fourth clock signal CLKD provided by the fifth sub-clock signal line CLK_5 becomes a low level, the second output signal OUT2<12> output by the sixth stage shift register unit 21 becomes a low level. At the same time, due to the bootstrap effect of the third capacitor C3, the electric potential of the second node Q2<12> also drops.

In the sixth stage 6, because the clock signals of 10CLK are used in this embodiment, the signals output by every five shift register units 21 (each stage sequentially outputs the first output signal OUT1 and the second output signal OUT2) form one cycle, at the same time, because the sixth stage shift register unit 21 receives the shift signal CR output by the tenth stage shift register unit 21 as the display reset signal STD, at this stage, in the case where the third clock signal CLKC provided by the seventeenth sub-clock signal line CLK_17 becomes a high level, the display reset signal STD received by the sixth stage shift register unit 21 is also a high level, so that the thirty-eighth transistor M38 and the thirty-ninth transistor M39 are turned on, and therefore, the fourth voltage VGL1 with a low level is used to reset the first node Q1<11> and the second node Q2<12>.

After the sixth stage shift register unit 21 drives the sub-pixel units in the eleventh and twelfth rows in the electronic panel to complete display; by analogy, the seventh stage shift register units 21, the eighth stage shift register units 21, and the other stage shift register units 21 drive the sub-pixel units in the electronic panel to complete the display driving of one frame row by row, whereby the display period of the first frame ends.

At the same time, during the display period DS of the first frame 1F, the third node H<11> in the sixth stage shift register unit is also charged. For example, in the case where in the first frame 1F, the twelfth row of sub-pixel units needs to be sensed, the following operations are also performed during the display period DS of the first frame 1F.

In the first stage 1, the selection control signal OE provided by the eleventh sub-clock signal line CLK_11 and the shift signal (the signal provided by the fifteenth sub-clock signal line CLK_15) output by the first sub-unit in the fourth stage shift register unit 21 are the same, so the first transistor M1 is turned on. At the same time, the second input signal STU2 received by the sixth stage shift register unit 21 and the shift signal output by the first sub-unit in the fourth stage shift register unit 21 are the same, so that the second input signal STU2 with a high level charges the third node H<11> to pull up the third node H<11> to a high level.

It should be noted that the foregoing charging process for the third node H<11> is only an example, and the embodiments of the present disclosure include but are not limited thereto. For example, the second input signal STU2 received by the sixth stage shift register unit 21 is the same as the shift signal output by the other stage shift register unit 21, and at the same time, the timing of the signal provided to the eleventh sub-clock signal line CLK_11 and the timing of the second input signal STU2 are the same.

In the first stage 1, because there is the overlap between the 10CLK clock signals that are used, in the case where the selection control signal OE is a high level, the third node H<13> in the seventh stage shift register unit is also charged to a high level.

The high electric potentials of H<11> and H<13> are, for example, maintained until the blanking period BL of the first frame 1F. In the case where the twelfth row of sub-pixel units need to be compensated in the first frame 1F, the following operations are performed during the blanking period BL of the first frame 1F.

In the seventh stage 7, the first clock signal CLKA provided by the twelfth sub-clock signal line CLK_12 is at a high level. For the sixth stage shift register unit, because the third node H<11> is maintained to be at a high level at this stage, the second transistor M2 is turned on, and the first clock signal CLKA with a high level is transmitted to the fourth node N<11> through the second transistor M2, so that the fourth node N<11> becomes a high level. The third transistor M3 and the fourth transistor M4 are turned on under the control of the fourth node N<11>, so the first voltage VDD with a high level charges the first node Q1<11> and the second node Q2<12>, respectively, so that the electric potentials of the first node Q1<11> and the second node Q2<12> are pulled up.

At the same time, in the seventh stage 7, due to the coupling effect of the first capacitor C1, in the case where the fourth node N<11> changes from a low level to a high level, the fourth node N<11> pulls up the third node H<11>, so that the third node H<11> is maintained at a high electric potential that is relatively high, which ensures that the second transistor M2 is fully turned on.

Then the first clock signal CLKA provided by the twelfth sub-clock signal line CLK_12 changes from a high level to a low level, so that the fourth node N<11> becomes a low level. Due to the coupling effect of the first capacitor C1, the electric potential of the third node H<11> also drops.

Similarly, for the seventh stage shift register unit, for the change processes of the third node H<13>, the fourth node N<13>, the first node Q1<13>, and the second node Q2<14>, reference may be made to the above description of the sixth stage shift register unit, and the change processes is not repeated here.

In the eighth stage 8, the third clock signal CLKC provided by the fourth sub-clock signal line CLK_4 becomes a high level, and the electric potential of the first node Q1<11> is further pulled up due to the bootstrap effect, so the seventh transistor M7 remains on, and thus the first output signal OUT1<11> output by the sixth stage shift register unit 21 becomes a high level.

At the same time, in the eighth stage 8, the fourth clock signal CLKD provided by the fifth sub-clock signal line CLK_5 becomes a high level, and the electric potential of the second node Q2<12> is further pulled up due to the bootstrap effect, so the ninth transistor M9 remains on, and thus the second output signal OUT2<12> output by the sixth stage shift register unit 21 becomes a high level.

It should be noted that, in the eighth stage 8, in the case where the third clock signal CLKC provided by the fourth sub-clock signal line CLK_4 becomes a low level, correspondingly, the electric potential of the first node Q1<11> in the sixth stage shift register unit 21 and the electric potential of the first output signal OUT1<11> also decrease. Similarly, in the case where the fourth clock signal CLKD provided by the fifth sub-clock signal line CLK_5 becomes a low level, correspondingly, the electric potential of the second node Q2<12> in the sixth stage shift register unit 21 and the electric potential of the second output signal OUT2<12> also decrease.

In the ninth stage 9, the fourth clock signal CLKD provided by the fifth sub-clock signal line CLK_5 becomes a high level, and the electric potential of the second node Q2<12> is further pulled up due to the bootstrap effect, so the ninth transistor M9 remains on, and thus the second output signal OUT2<12> output by the sixth stage shift register unit 21 becomes a high level.

At the same time, in the ninth stage 9, the third clock signal CLKC provided by the sixth sub-clock signal line CLK_6 becomes a high level, the electric potential of the first node Q1<13> is further pulled up due to the bootstrap effect, so the seventh transistor M7 remains on, and thus the first output signal OUT1<13> output by the seventh stage shift register unit 21 becomes a high level.

It should be noted that, in the ninth stage 9, in the case where the fourth clock signal CLKD provided by the fifth sub-clock signal line CLK_5 becomes a low level, correspondingly, the electric potential of the second node Q2<12> in the sixth stage shift register unit 21 and the electric potential of the second output signal OUT2<12> also decrease.

In the tenth stage 10, the fourth clock signal CLKD provided by the fifth sub-clock signal line CLK_5 becomes a low level, and accordingly, the electric potential of the second node Q2<12> in the sixth stage shift register unit 21 and the electric potential of the second output signal OUT2<12> also decrease.

At the same time, in the tenth stage 10, the third clock signal CLKC provided by the sixth sub-clock signal line CLK_6 becomes a high level. Accordingly, the electric potential of the first node Q1<13> in the seventh stage shift register unit 21 and the electric potential of the first output signal OUT1<13> also decrease.

In the eleventh stage 11, the tenth sub-clock signal line CLK_10 and the eleventh sub-clock signal line CLK_11 provide high levels, and both the fortieth transistor M40 and the forty-first transistor M41 in each stage shift register unit 21 are turned on, so that the first node Q1 and the second node Q2 in each stage shift register unit 21 are reset; the first transistor M1 in each stage shift register unit 21 is turned on, and because the received second input signal STU2 is a low level at this time, the third node H in each stage shift register unit 21 is reset, thereby completing the global reset.

Therefore, the driving timing of the first frame ends. For subsequent driving of the gate driving circuit in the second frame, the third frame, and the like, reference may be made to the foregoing description, and details are not described herein again.

It should be noted that, in the embodiments of the present disclosure, the timing of two signals being the same means that the time when the signals are at a high level is synchronous, and it is not required that the amplitudes of the two signals are the same.

Figure 17:
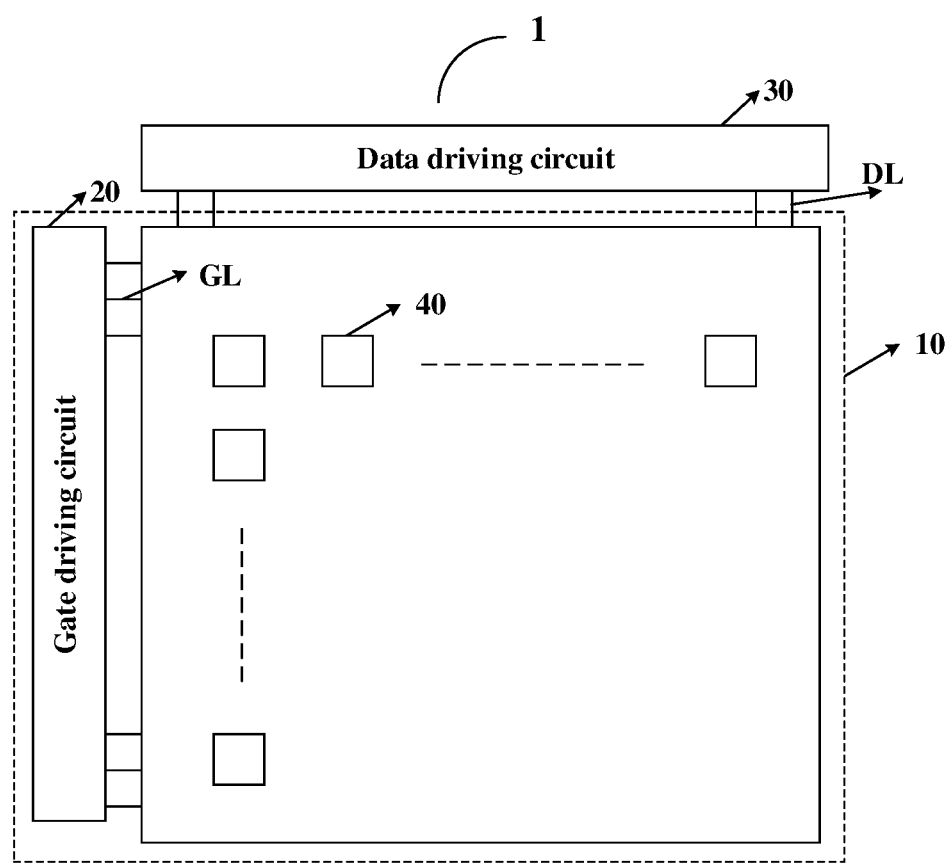
FIG. 17 is a schematic diagram of a display device provided by at least one embodiment of the present disclosure.

The embodiments of the present disclosure further provide a display device 1. As shown in FIG. 17, the display device 1 includes the electronic panel 10 provided by any one of the embodiments of the present disclosure, and a pixel array including a plurality of sub-pixel units 40 is provided in the electronic panel 10.

The first output signal OUT1 and the second output signal OUT2 that are output by each shift register unit in the gate driving circuit 20 are respectively provided to different rows of sub-pixel units 40. For example, the gate driving circuit 20 is electrically connected to the sub-pixel units 40 through the gate lines GL. The gate driving circuit 20 is used to provide the driving signals to the pixel array. For example, the driving signals may drive the scanning transistor and the sensing transistor in the sub-pixel unit 40.

For example, the display device 1 further includes a data driving circuit 30, and the data driving circuit 30 is used for providing the data signals to the pixel array. For example, the data driving circuit 30 is electrically connected to the sub-pixel units 40 through the data lines DL.

It should be noted that the display device 1 in the embodiments may be any product or component having a display function such as a display, an OLED panel, an OLED TV, a mobile phone, a tablet computer, a notebook computer, a digital photo frame, a navigator, or the like.

For technical effects of the display device 1 provided by the embodiments of the present disclosure, reference may be made to the corresponding descriptions of the electronic panel 10 in the foregoing embodiments, and details are not described herein again.

What are described above are only specific implementations of the present disclosure, but the protection scope of the present disclosure is not limited thereto, and the protection scope of the present disclosure is defined by the protection scope of the accompanying claims.

What is claimed is:

1. An electronic panel, comprising a plurality of sub-pixel units arranged in an array and a gate driving circuit, the array comprising N rows and M columns, wherein each sub-pixel unit among the plurality of sub-pixel units comprises: a light emitting unit, a pixel driving circuit configured to drive the light emitting unit to emit light, and a sensing circuit configured to sense the pixel driving circuit;

the gate driving circuit comprises N+1 output terminals arranged in sequence, and the gate driving circuit is configured to output gate scanning signals that turn on the N rows of the array of the plurality of sub-pixel units row by row;

pixel driving circuits of sub-pixel units in a j-th row among the N rows are connected to a j-th output terminal among the N+1 output terminals of the gate driving circuit to receive a gate scanning signal as a scanning driving signal, and sensing circuits of the sub-pixel units in the j-th row are connected to a (j+1)-th output terminal among the N+1 output terminals of the gate driving circuit to receive a gate scanning signal as a sensing driving signal;

wherein 1≤j≤N, and N and M are integers greater than or equal to 2;

wherein the gate driving circuit comprises a plurality of shift register units which are cascaded, and each shift register unit of the plurality of shift register units comprises a first sub-unit, a second sub-unit, and a blanking input sub-unit;

the first sub-unit comprises a first input circuit and a first output circuit, the first input circuit is configured to control a level of a first node in response to a first input signal, and the first output circuit is configured to output a shift signal and a first output signal under control of the level of the first node;

the second sub-unit comprises a second input circuit and a second output circuit, the second input circuit is configured to control a level of a second node in response to the first input signal, and the second output circuit is configured to output a second output signal under control of the level of the second node; and the blanking input sub-unit is connected to the first node and the second node, and is configured to receive a selection control signal and control the level of the first node and the level of the second node.

2. The electronic panel according to claim 1, wherein the pixel driving circuit comprises a data writing circuit, a driving circuit, and a charge storage circuit;

the driving circuit is connected to the data writing circuit, the charge storage circuit, the light emitting unit, and the sensing circuit, and the driving circuit is configured to control a driving current for driving the light emitting unit to emit light;

the data writing circuit is further connected to the charge storage circuit, and the data writing circuit is configured to receive the scanning driving signal and to write a data signal to the driving circuit in response to the scanning driving signal;

the sensing circuit is further connected to the charge storage circuit and the light emitting unit, and the sensing circuit is configured to receive the sensing driving signal, and to write a reference voltage signal to the driving circuit in response to the sensing driving signal or to read a sensing voltage signal from the driving circuit; and the charge storage circuit is further connected to the light emitting unit and is configured to store the data signal and the reference voltage signal, which are written.

3. The electronic panel according to claim 2, further comprising M data lines and M sensing lines, wherein data writing circuits of sub-pixel units in a k-th column among the M columns are connected to a k-th data line among the M data lines to receive the data signal; and sensing circuits of the sub-pixel units in the k-th column are connected to a k-th sensing line among the M sensing lines to receive the reference voltage signal or to output the sensing voltage signal;

wherein 1≤k≤M.

4. The electronic panel according to claim 3, further comprising N+1 gate lines arranged in sequence, wherein the N+1 gate lines are respectively connected to the N+1 output terminals of the gate driving circuit in one-to-one correspondence manner;

data writing circuits of the sub-pixel units in the j-th row are connected to the j-th output terminal of the gate driving circuit through a j-th gate line among the N+1 gate lines; and sensing circuits of the sub-pixel units in the j-th row are connected to the (j+1)-th output terminal of the gate driving circuit through a (j+1)-th gate line among the N+1 gate lines.

5. The electronic panel according to claim 2, further comprising N+1 gate lines arranged in sequence, wherein
the N+1 gate lines are respectively connected to the N+1 output terminals of the gate driving circuit in one-to-one correspondence manner;
data writing circuits of the sub-pixel units in the j-th row are connected to the j-th output terminal of the gate driving circuit through a j-th gate line among the N+1 gate lines; and
sensing circuits of the sub-pixel units in the j-th row are connected to the (j+1)-th output terminal of the gate driving circuit through a (j+1)-th gate line among the N+1 gate lines.

6. The electronic panel according to claim 2, wherein the data writing circuit comprises a scanning transistor, the driving circuit comprises a driving transistor, the sensing circuit comprises a sensing transistor, and the charge storage circuit comprises a storage capacitor;
a gate electrode of the scanning transistor is configured to receive the scanning driving signal, a first electrode of the scanning transistor is configured to receive the data signal, and a second electrode of the scanning transistor is connected to a gate electrode of the driving transistor;
a first electrode of the driving transistor is configured to receive a first driving voltage for generating the driving current, and a second electrode of the driving transistor is connected to a first electrode of the sensing transistor;
a gate electrode of the sensing transistor is configured to receive the sensing driving signal, and a second electrode of the sensing transistor is configured to receive the reference voltage signal or output the sensing voltage signal; and
a first electrode of the storage capacitor is connected to the gate electrode of the driving transistor, and a second electrode of the storage capacitor is connected to the second electrode of the driving transistor.

7. The electronic panel according to claim 1, further comprising N+1 gate lines arranged in sequence, wherein
the N+1 gate lines are respectively connected to the N+1 output terminals of the gate driving circuit in one-to-one correspondence manner;
the pixel driving circuits of the sub-pixel units in the j-th row are connected to the j-th output terminal of the gate driving circuit through a j-th gate line among the N+1 gate lines; and
the sensing circuits of the sub-pixel units in the j-th row are connected to the (j+1)-th output terminal of the gate driving circuit through a (j+1)-th gate line among the N+1 gate lines.

8. The electronic panel according to claim 1, wherein the blanking input sub-unit comprises a selection control circuit, a third input circuit, a first transmission circuit, and a second transmission circuit, wherein
the selection control circuit is configured to control a level of a third node using a second input signal in response to the selection control signal and maintain the level of the third node;

the third input circuit is configured to control a level of a fourth node under control of the level of the third node;
the first transmission circuit is electrically connected to the first node and the fourth node, and is configured to control the level of the first node under control of the level of the fourth node or under control of a first transmission signal; and
the second transmission circuit is electrically connected to the second node and the fourth node, and is configured to control the level of the second node under control of the level of the fourth node or under control of a second transmission signal.

9. The electronic panel according to claim 1, wherein the first sub-unit further comprises a first control circuit, a first reset circuit, a second reset circuit, a shift signal output terminal, and a first output signal terminal; the second sub-unit further comprises a second control circuit, a third reset circuit, a fourth reset circuit, and a second output signal terminal;
the shift signal output terminal is configured to output the shift signal, the first output signal terminal is configured to output the first output signal, the second output signal terminal is configured to output the second output signal;
the first control circuit is configured to control a level of a fifth node under control of both the level of the first node and a second voltage;
the first reset circuit is configured to reset the first node, the shift signal output terminal, and the first output signal terminal under control of the level of the fifth node;
the second reset circuit is configured to reset the first node, the shift signal output terminal, and the first output signal terminal under control of a level of a sixth node;
the second control circuit is configured to control the level of the sixth node under control of both the level of the second node and a third voltage;
the third reset circuit is configured to reset the second node and the second output signal terminal under control of the level of the sixth node; and
the fourth reset circuit is configured to reset the second node and the second output signal terminal under control of the level of the fifth node.

10. The electronic panel according to claim 9, wherein the blanking input sub-unit further comprises a common reset circuit;
the common reset circuit is electrically connected to the fourth node, the fifth node, and the sixth node, and is configured to reset the fourth node under control of the level of the fifth node or under control of the level of the sixth node.

11. The electronic panel according to claim 9, wherein
the first sub-unit further comprises a third control circuit and a fourth control circuit, the third control circuit is configured to control the level of the fifth node in response to a first clock signal, and the fourth control circuit is configured to control the level of the fifth node in response to the first input signal; and
the second sub-unit further comprises a fifth control circuit and a sixth control circuit, the fifth control circuit is configured to control the level of the sixth node in response to the first clock signal, and the sixth control circuit is configured to control the level of the sixth node in response to the first input signal.

12. The electronic panel according to claim 9, wherein the electronic panel is a display panel;

the first sub-unit further comprises a fifth reset circuit and a sixth reset circuit, the fifth reset circuit is configured to reset the first node in response to a display reset signal, and the sixth reset circuit is configured to reset the first node in response to a global reset signal; and the second sub-unit further comprises a seventh reset circuit and an eighth reset circuit, the seventh reset circuit is configured to reset the second node in response to the display reset signal, and the eighth reset circuit is configured to reset the second node in response to the global reset signal.

13. The electronic panel according to claim 12, wherein the shift register unit further comprises a common electric-leakage prevention circuit, a first electric-leakage prevention circuit, and a second electric-leakage prevention circuit;

the common electric-leakage prevention circuit is electrically connected to the first node and a seventh node, and is configured to control a level of the seventh node under control of the level of the first node;

the first electric-leakage prevention circuit is electrically connected to the seventh node, the first reset circuit, the second reset circuit, the fifth reset circuit, and the sixth reset circuit, and the first electric-leakage prevention circuit is configured to prevent electric leakage at the first node under control of the level of the seventh node; and the second electric-leakage prevention circuit is electrically connected to the seventh node, the third reset circuit, the fourth reset circuit, the seventh reset circuit, and the eighth reset circuit, and the second electric-leakage prevention circuit is configured to prevent electric leakage at the second node under control of the level of the seventh node.

14. A display device, comprising the electronic panel according to claim 1.

15. A driving method of an electronic panel the electronic panel according to claim 1, wherein the electronic panel is a display panel;

in the driving method, a period for one frame comprises a display period and a blanking period, wherein during the display period, in each sub-pixel unit, the pixel driving circuit is configured to drive the light emitting unit to emit light; and during the blanking period, an i-th row of the plurality of sub-pixel units is randomly selected from the N rows of the plurality of sub-pixel units, so that sensing circuits in the i-th row of the plurality of sub-pixel units perform sensing;

wherein $1 \leq i \leq N$.

16. A driving method of an electronic panel, wherein the electronic panel is a display panel; the electronic panel comprises a plurality of sub-pixel units arranged in an array and a gate driving circuit, the array comprises N rows and M columns, each sub-pixel unit among the plurality of sub-pixel units comprises: a light emitting unit, a pixel driving circuit configured to drive the light emitting unit to emit light, and a sensing circuit configured to sense the pixel driving circuit;

the gate driving circuit comprises N+1 output terminals arranged in sequence, and the gate driving circuit is configured to output gate scanning signals that turn on the N rows of the array of the plurality of sub-pixel units row by row;

pixel driving circuits of sub-pixel units in a j-th row among the N rows are connected to a j-th output terminal among the N+1 output terminals of the gate driving circuit to receive a gate scanning signal as a scanning driving signal, and sensing circuits of the sub-pixel units in the j-th row are connected to a (j+1)-th output terminal among the N+1 output terminals of the gate driving circuit to receive a gate scanning signal as a sensing driving signal;

wherein $1 \leq j \leq N$, and N and M are integers greater than or equal to 2, in the driving method, a period for one frame comprises a display period and a blanking period, wherein during the display period, in each sub-pixel unit, the pixel driving circuit is configured to drive the light emitting unit to emit light; and during the blanking period, an i-th row of the plurality of sub-pixel units is randomly selected from the N rows of the plurality of sub-pixel units, so that sensing circuits in the i-th row of the plurality of sub-pixel units perform sensing;

wherein $1 \leq i \leq N$, wherein the display period comprises a data writing stage, a holding stage, and a light-emitting stage; in a case where the pixel driving circuit comprises a data writing circuit, a driving circuit, and a charge storage circuit, in the data writing stage, the data writing circuit and the sensing circuit are turned on, and a data signal and a reference voltage signal are respectively written through the data writing circuit and the sensing circuit;

in the holding stage, the data writing circuit is turned off, the sensing circuit is turned on, and the charge storage circuit holds the data signal and the reference voltage signal; and in the light-emitting stage, the data writing circuit and the sensing circuit are turned off, the driving circuit is turned on, and the driving circuit drives the light emitting unit to emit light according to the data signal.

17. A driving method of an electronic panel, wherein the electronic panel is a display panel; the electronic panel comprises a plurality of sub-pixel units arranged in an array and a gate driving circuit, the array comprises N rows and M columns, each sub-pixel unit among the plurality of sub-pixel units comprises: a light emitting unit, a pixel driving circuit configured to drive the light emitting unit to emit light, and a sensing circuit configured to sense the pixel driving circuit;

the gate driving circuit comprises N+1 output terminals arranged in sequence, and the gate driving circuit is configured to output gate scanning signals that turn on the N rows of the array of the plurality of sub-pixel units row by row;

pixel driving circuits of sub-pixel units in a j-th row among the N rows are connected to a j-th output terminal among the N+1 output terminals of the gate driving circuit to receive a gate scanning signal as a scanning driving signal, and sensing circuits of the sub-pixel units in the j-th row are connected to a (j+1)-th output terminal among the N+1 output terminals of the gate driving circuit to receive a gate scanning signal as a sensing driving signal;

wherein $1 \leq j \leq N$, and N and M are integers greater than or equal to 2, in the driving method, a period for one frame comprises a display period and a blanking period, wherein during the display period, in each sub-pixel unit, the pixel driving circuit is configured to drive the light emitting unit to emit light; and during the blanking period, an i-th row of the plurality of sub-pixel units is randomly selected from the N rows of the plurality of sub-pixel units, so that sensing circuits in the i-th row of the plurality of sub-pixel units perform sensing;

wherein $1 \leq i \leq N$, wherein the blanking period comprises a reset stage, a restoring stage, a charging stage, and a sensing stage; in a case where the pixel driving circuit comprises a data writing circuit, a driving circuit, and a charge storage circuit, when sensing the i-th row of the plurality of sub-pixel units, in the reset stage, driving circuits of sub-pixel units in an (i−1)-th row among the N rows are turned off;

in the restoring stage, data writing circuits and sensing circuits, which are in sub-pixel units of the i-th row, are turned on, and data signals are respectively written through the data writing circuits and reference voltage signals are respectively written through the sensing circuits to turn on driving circuits of the sub-pixel units in the i-th row;

in the charging stage, the data writing circuits of the sub-pixel units in the i-th row are turned off, the sensing circuits of the sub-pixel units in the i-th row are turned on, and the sensing circuits of the sub-pixel units in the i-th row are charged through the driving circuits of the sub-pixel units in the i-th row; and in the sensing stage, the data writing circuits of the sub-pixel units in the i-th row are turned off, the sensing circuits of the sub-pixel units in the i-th row are turned on, and sensing voltage signals are output through the sensing circuits of the sub-pixel units in the i-th row.

18. The driving method according to claim 17, wherein in the reset stage, data writing circuits and sensing circuits, which are in the sub-pixel units of the (i−1)-th row, are turned on, and correction voltages are respectively written by the data writing circuits and the sensing circuits, which are in the sub-pixel units of the (i−1)-th row, to turn off the driving circuits of the sub-pixel units in the (i−1)-th row.

* * * * *